United States Patent
Ohkase et al.

[11] Patent Number: 6,111,225
[45] Date of Patent: Aug. 29, 2000

[54] WAFER PROCESSING APPARATUS WITH A PROCESSING VESSEL, UPPER AND LOWER SEPARATELY SEALED HEATING VESSELS, AND MEANS FOR MAINTAINING THE VESSELS AT PREDETERMINED PRESSURES

[75] Inventors: Wataru Ohkase, Sagamihara; Kazutsugu Aoki; Masaaki Hasei, both of Tsukui-gun, all of Japan

[73] Assignee: Tokyo Electron Limited, Tokyo-To, Japan

[21] Appl. No.: 09/125,336

[22] PCT Filed: Feb. 21, 1997

[86] PCT No.: PCT/JP97/00477

§ 371 Date: Aug. 14, 1998

§ 102(e) Date: Aug. 14, 1998

[87] PCT Pub. No.: WO97/31389

PCT Pub. Date: Aug. 28, 1997

[30] Foreign Application Priority Data

Feb. 23, 1996 [JP] Japan .................................. 8-061808
Sep. 18, 1996 [JP] Japan .................................. 8-267774
Sep. 18, 1996 [JP] Japan .................................. 8-267775

[51] Int. Cl.[7] ............................................ F27B 5/14
[52] U.S. Cl. ...................... 219/390; 219/411; 118/724; 118/725
[58] Field of Search ..................... 219/390, 411; 392/416, 418; 118/724, 725, 728, 733, 50.1

[56] References Cited

U.S. PATENT DOCUMENTS

| | | | |
|---|---|---|---|
| 4,535,228 | 8/1985 | Mirmura et al. | 219/411 |
| 4,780,174 | 10/1988 | Lan et al. | 156/610 |
| 5,194,401 | 3/1993 | Adams et al. | 437/173 |
| 5,427,625 | 6/1995 | Okase et al. | 134/21 |
| 5,536,918 | 7/1996 | Ohkase et al. | 219/390 |
| 5,592,581 | 1/1997 | Okase | 392/418 |
| 5,651,670 | 7/1997 | Okase et al. | 432/5 |
| 5,772,770 | 6/1998 | Suda et al. | 118/719 |
| 5,777,300 | 7/1998 | Homma et al. | 219/679 |

FOREIGN PATENT DOCUMENTS

| | | |
|---|---|---|
| 62-149798 | 9/1987 | Japan . |
| 1-123413 | 5/1989 | Japan . |
| 5-90165 | 4/1993 | Japan . |
| 6-120142 | 4/1994 | Japan . |
| 6-295871 | 10/1994 | Japan . |
| 8-8194 | 1/1996 | Japan . |

OTHER PUBLICATIONS

International Preliminary Examination Report for PCT Application No. PCT/JP97/00477.

*Primary Examiner*—Teresa Walberg
*Assistant Examiner*—Shawntina Fuqua
*Attorney, Agent, or Firm*—Smith Gambrell & Russell, LLP

[57] ABSTRACT

A thermal processing apparatus for a semi-conductor wafer. A holder is provided within a processing vessel on which the wafer to be processed is placed. Upper and lower heaters are provided above and below the holder in order to heat the wafer. Each of the heaters are attached within heating vessels. A gas supply head supplies a processing gas in a shower form between the upper heater and the holder. The uniformity of the surface temperature of the wafer is improved by heating the wafer from both above and below.

14 Claims, 18 Drawing Sheets

WAFER PROCESSING APPARATUS WITH A PROCESSING VESSEL, UPPER AND LOWER SEPARATELY SEALED HEATING VESSELS, AND MEANS FOR MAINTAINING THE VESSELS AT PREDETERMINED PRESSURES

TECHNICAL FIELD

The present invention relates to a single-wafer type of thermal processing apparatus for subjecting a semiconductor wafer or the like to a thermal process such as film-formation, oxidation, or thermal diffusion.

BACKGROUND ART

During the fabrication of a semiconductor integrated circuit, thermal processing steps for performing film-formation, oxidation, or diffusion on a surface of a semiconductor wafer and pattern-etching steps are generally repeated. When wafers of, for example, an 8-inch size are to be subjected to thermal processing, a vertical batch type of thermal processing apparatus is mainly used in the art because it is capable of subjecting a large number of wafers to thermal processing at the same time. An important point with this type of thermal processing is good control over the uniformity of temperature within the wafer surface, from the viewpoint of improving uniformity of the characteristics of the completed circuits, and hence the yield thereof.

Concomitant with the increasing integration and decreasing size of circuits, the wafer size is also increasing, so that the use of wafers such as those of 12 inches in size is being investigated.

If such wafers increase in size from 8 inches to 12 inches (approximately 30 cm), the self-weight of each wafer is multiplied to approximately 2.5 to 3 times that of an 8-inch wafer, and moreover considerations of thermal uniformity within the wafer surface make it difficult for a prior-art batch type of vertical thermal processing apparatus to cope therewith. In other words, one result of the multiplication of the self-weight of the wafer as described above is that a wafer boat for holding a large number of wafers cannot cope from the strength point of view; alternatively, because the surface area of the wafer has increased due to the increase in diameter, a method that relies on heating from the sides of wafers that are arrayed at a predetermined pitch will find it difficult to heat the wafer surfaces uniformly.

To solve the above problems, there have been various proposals for a single-wafer type of thermal processing apparatus for processing one wafer at a time, wherein a wafer that is supported or mounted on a wafer holder is heated by a halogen lamp or resistance heater of the apparatus, disposed below the wafer holder. However, if such a prior-art single-wafer type of thermal processing apparatus is used to heat a larger-diameter wafer, it is fairly difficult to achieve good uniformity of the surface temperature of the wafer, with the amount of heat generated per unit surface area by a heater of a current type, and it can not be said that a conventional apparatus is sufficient therefor.

The present invention was devised in order to solve the above problems. A main objective of the present invention is to provide a single-wafer type of thermal processing apparatus that is capable of improving the uniformity of temperature within the surface of an object to be processed, such as a wafer.

DISCLOSURE OF INVENTION

In order to achieve the above objective, the present invention provides a thermal processing apparatus having a processing vessel and a holder for an object to be processed, which is provided within the processing vessel to hold an object to be processed, wherein the thermal processing apparatus comprises: a lower heating means provided within the processing vessel and below the holder, for heating the object to be processed; an upper heating means provided within the processing vessel and above the holder for an object, for heating the object; and a processing gas supply means for supplying a processing gas to an area between the holder and the upper heating means.

By disposing heating means above and below the holder and by also providing a gas supply portion between the holder for an object to be processed and the upper heating means in this manner, the object to be processed can be heated from both surfaces thereof so that the heating of the object to be processed can be achieved with good control, both uniformly and at a high level of energy; it is possible to supply the processing gas directly to the object to be processed; and it is also possible to prevent the formation of unwanted films on components such as the processing vessel and increase the uniformity of the processing performed on the object to be processed.

It is thus possible to provide a predetermined gas supply system and gas exhaust system within each of the heating means vessels for the upper and lower heating means that are isolated in an airtight manner from the processing vessel. In such a case, the pressure differences between the interior of the processing vessel and the interiors of the heating means vessels can be made extremely small; the partitioning walls between the heating means vessels and the processing vessel can be thinned by a consequent amount to a degree at which they can cope with such pressure differences; and thus the thermal efficiency of each heating means can be increased, the uniformity of surface temperature can be improved, and the controllability of heating can be improved.

BEST MODE FOR CARRYING OUT THE INVENTION

Embodiments of the thermal processing apparatus in accordance with the present invention will be described below, with reference to the accompanying drawings.

Figure 1:
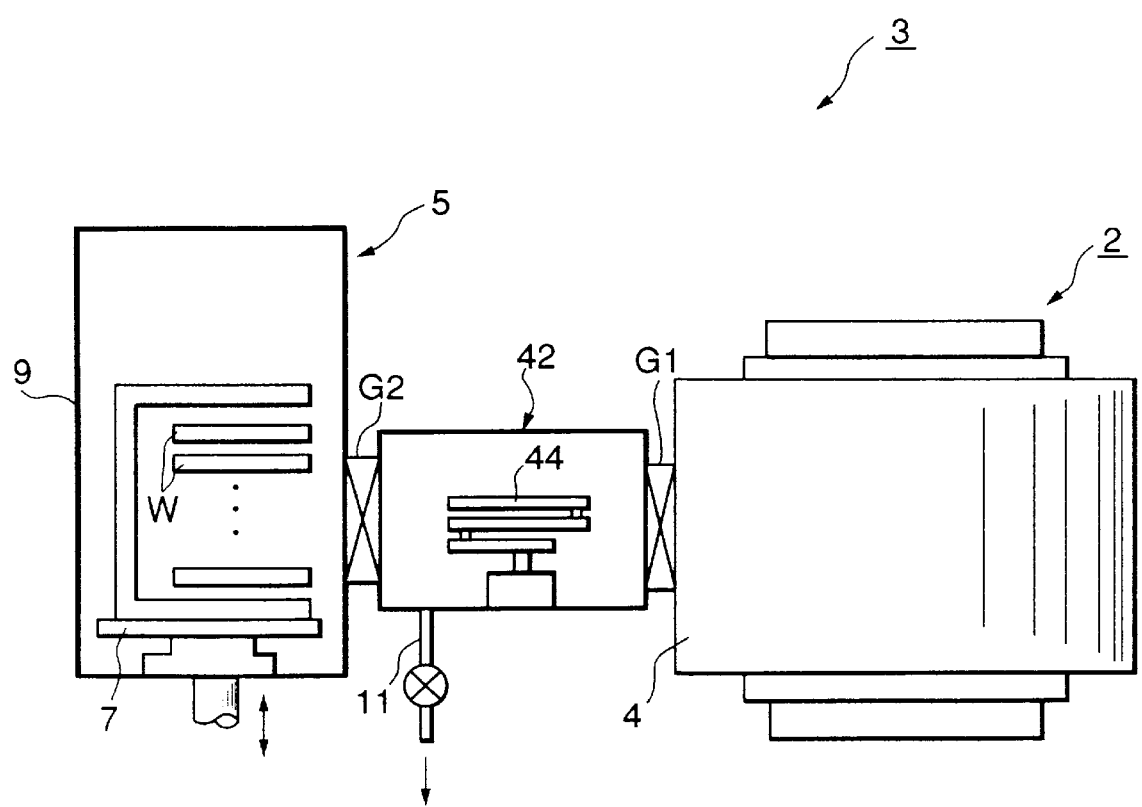
FIG. 1 is an overall view of a processing system comprising a single-wafer thermal processing apparatus in accordance with this invention.

A processing system that uses the thermal processing apparatus of the present invention is shown schematically in FIG. 1. In addition to a thermal processing apparatus 2 in accordance with this invention, which essentially subjects an object to be processed (a semiconductor wafer) to thermal processing, a thermal processing system 3 shown in this figure is mainly configured of a load-lock chamber 42 provided in a vacuum-sealable manner at a previous stage of the thermal processing apparatus 2, with a gate valve G1 therebetween, and a cassette chamber 5 provided at a previous stage of the load-lock chamber 42, with a gate valve G2 therebetween.

Within this cassette chamber 5 is provided an elevatable cassette stand 7 with a cassette 9 containing a plurality of wafers W, such as 5 to 35 wafers, mounted thereupon. The load-lock chamber 42 is connected to a vacuum exhaust system 11 with a vacuum pump (not shown in the figure) therebetween so that the interior thereof can be evacuated. A robot having an extendable and rotatable conveyor arm 44 is provided in the interior of the load-lock chamber 42 in such a manner that the wafers W can be transferred to and from the thermal processing apparatus 2 and the cassette chamber 5 thereby. Note that a supply system (not shown in the figure) for an inert purging gas such as $N_2$ is also provided in the load-lock chamber 42.

Figure 2:
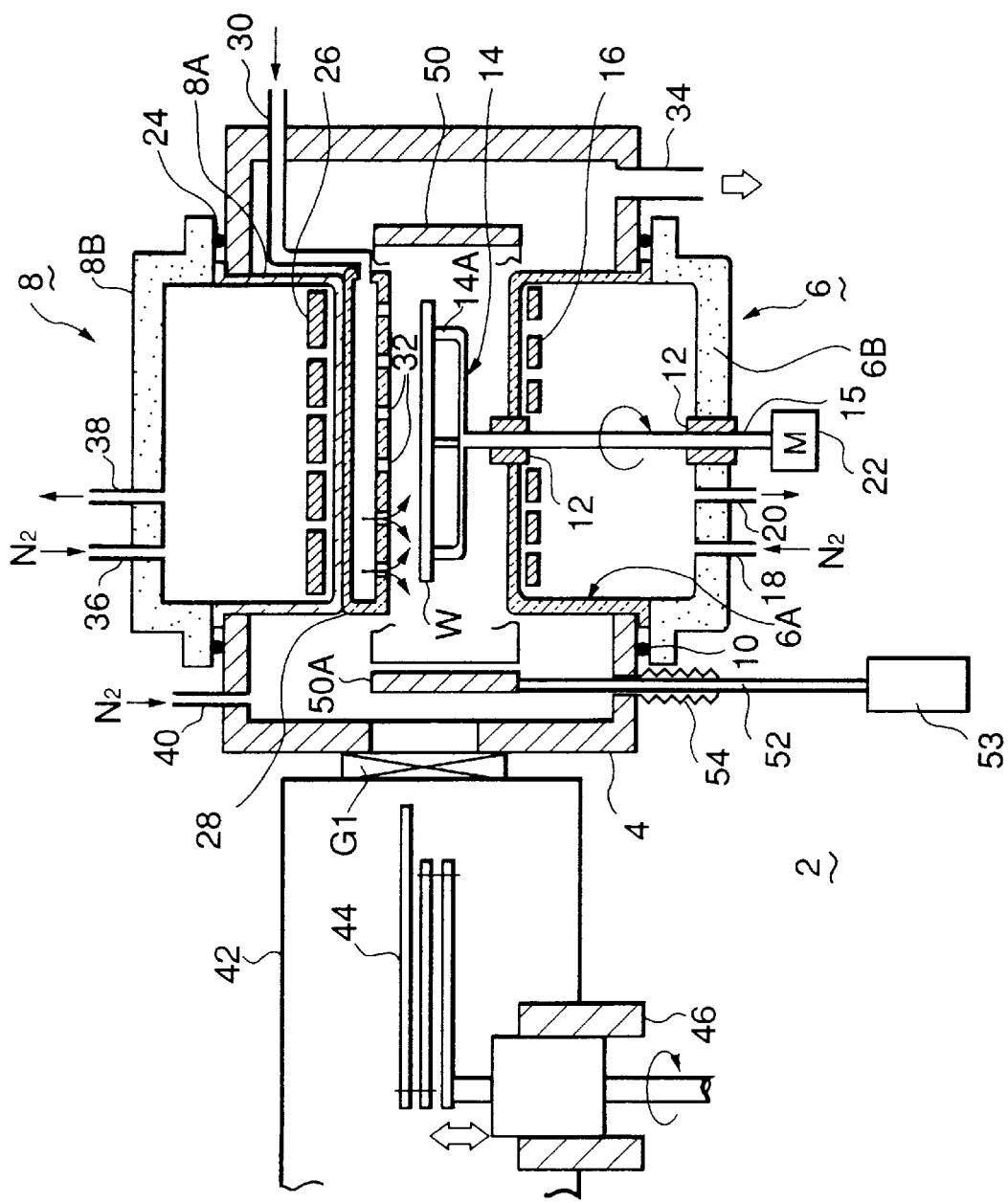
FIG. 2 is a sectional view through a first embodiment of the single-wafer thermal processing apparatus within the processing system of FIG. 1.

The thermal processing apparatus 2 has a processing vessel 4 that is formed to a cylindrical shape of a material such as aluminum, and apertures are formed in each of a base portion and a ceiling portion of the processing vessel 4, as shown in FIG. 2. A lower heating means vessel 6 made of a material such as quartz is provided in a hermetically sealed state within the aperture of the base portion and an upper heating means vessel 8 made of the same quartz is provided in a sealed state within the aperture of the ceiling portion, such that each is separated hermetically from the interior of the processing vessel 4.

This lower heating means vessel 6 is configured of a thin dome-shaped portion 6A, which is inserted in a convex form towards the interior of the processing vessel 4 and has a flat upper edge, and a thick-plate lid portion 6B, which is provided to cover a lower aperture thereof and has an outer side exposed to the atmosphere, with the lower heating means vessel 6 being provided in an airtight manner in the base portion of the processing vessel 4 with a sealing member 10 such as an O-ring therebetween.

The thickness of the thin dome-shaped portion 6A is set to be as thin as approximately 4 mm, for example, which suppresses thermal losses in this portion and also gives a favorable thermal response characteristic. Since the thickness of this dome-shaped portion 6A is made thin in this manner, this allows the pressure within this lower heating means vessel 6 to vary to follow pressure variations within the processing vessel 4, as will be described later, and the pressure difference within the two vessels can be set in such a manner that it is less than the pressure resistance of the dome-shaped portion 6A. The thickness of the thick-plate lid portion 6B is set to a thickness that provides resistance to atmospheric pressure, such as approximately 15 to 20 mm.

A support shaft 15 of a holder 14 for an object to be processed, made of a material such as quartz, is passed in an airtight manner vertically through a central portion of the lower heating means vessel 6 with a magnetic fluid seal 12 therebetween, so as to be provided rotatably therein in order to heat the wafer uniformly, three claw portions 14A are formed in the upper edge of the holder 14 to be disposed equidistantly on the same periphery thereof, and the configuration is such that a peripheral portion of the rear surface of a semiconductor wafer W which is the object to be processed is supported on the claw portions 14A.

In this case, the dome-shaped portion 6A intrudes in a convex manner into the processing vessel 4, as described above, and is formed to be as close as possible to the rear surface of the semiconductor wafer W, means such as a resistance heater 16 is provided over substantially the entire surface of the inner side of an upper edge flat surface portion of this dome-shaped portion 6A as a lower heating means, with the configuration being such that the wafer W is heated from the lower surface thereof. A rotational drive mechanism 22 like a motor, for example, is provided on a lower portion of the support shaft 15 of the holder 14, with the configuration being such that the wafer W is heated while rotating.

A purge gas introduction port 18 for introducing a purge gas such as $N_2$ into the lower heating means vessel 6 and a purge gas exhaust port 20 for exhausting the internal environmental gas therefrom are each provided in the thick-plate lid portion 6B.

In a similar manner to the lower heating means vessel 6, the upper heating means vessel 8 is configured of a thin bowl-shaped portion 8A, which is inserted in a convex form towards the interior of the processing vessel 4 and has a flat lower edge, and a thick-plate lid portion 8B, which is provided to cover a upper aperture thereof and has an outer side exposed to the atmosphere, with the upper heating means vessel 8 being provided in an airtight manner in the ceiling portion of the processing vessel 4 with a sealing member 24 such as an O-ring therebetween.

The thickness of the bowl-shaped portion 8A is set to be as thin as approximately 4 mm, for example, which suppresses thermal losses in this portion and also gives a favorable thermal response characteristic.

Since the thickness of this bowl-shaped portion 8A is made thin in this manner, this allows the pressure within this upper heating means vessel 8 to vary to follow pressure variations within the processing vessel 4, and the pressure difference within the two vessels can be set in such a manner that it is less than the pressure resistance of the bowl-shaped portion 8A. The thickness of the thick-plate lid portion 8B is set to a thickness that provides resistance to atmospheric pressure, such as approximately 15 to 20 mm.

Means such as a resistance heater 26 is provided over substantially the entire surface of the inner side of a lower edge flat surface portion of this bowl-shaped portion 8A as an upper heating means, with the configuration being such that the wafer W is heated from the upper surface thereof. In this case, the distance between each of the upper and lower resistance heaters 26 and 16 from the wafer W is set to be extremely small, such as on the order of 10 mm, so that the wafer W is heated efficiently from above and below.

A gas supply head 28 that has a vessel-shaped showerhead structure and is made of a material such as quartz is provided on a lower surface side of the upper heating means vessel 8, and a processing gas introduction pipeline 30 for introducing a processing gas is connected thereto. The configuration is such that the processing gas introduced by this introduction pipeline 30 is ejected from a large number of ejection holes 32 provided over the entire lower surface of the gas supply head 28 towards the entire region of the upper surface of the wafer W.

A purge gas introduction port 36 for introducing a purge gas such as $N_2$ into the upper heating means vessel 8 and a purge gas exhaust port 38 for exhausting the internal environmental gas therefrom are each provided in the thick-plate lid portion 8B.

A gas exhaust port 34 connected to a vacuum pump (not shown in the figure) for exhausting the environment within the processing vessel 4 is provided in a peripheral edge portion of the base portion thereof, and a purge gas introduction port 40 for introducing a purge gas such as $N_2$ into the processing vessel 4 is provided in the ceiling portion thereof. Note that the gas supply head 28 could also be used as the purge gas introduction port 40.

The gate valve G1 that is opened and closed when a wafer W is conveyed in or out is provided in a side wall of the processing vessel 4, the load-lock chamber 42 is provided via the gate valve G1, and the base of the conveyor arm 44 therewithin is supported on an elevatable sliding mechanism 46 so that the entire arm 44 can be raised and lowered thereby.

Figure 3:
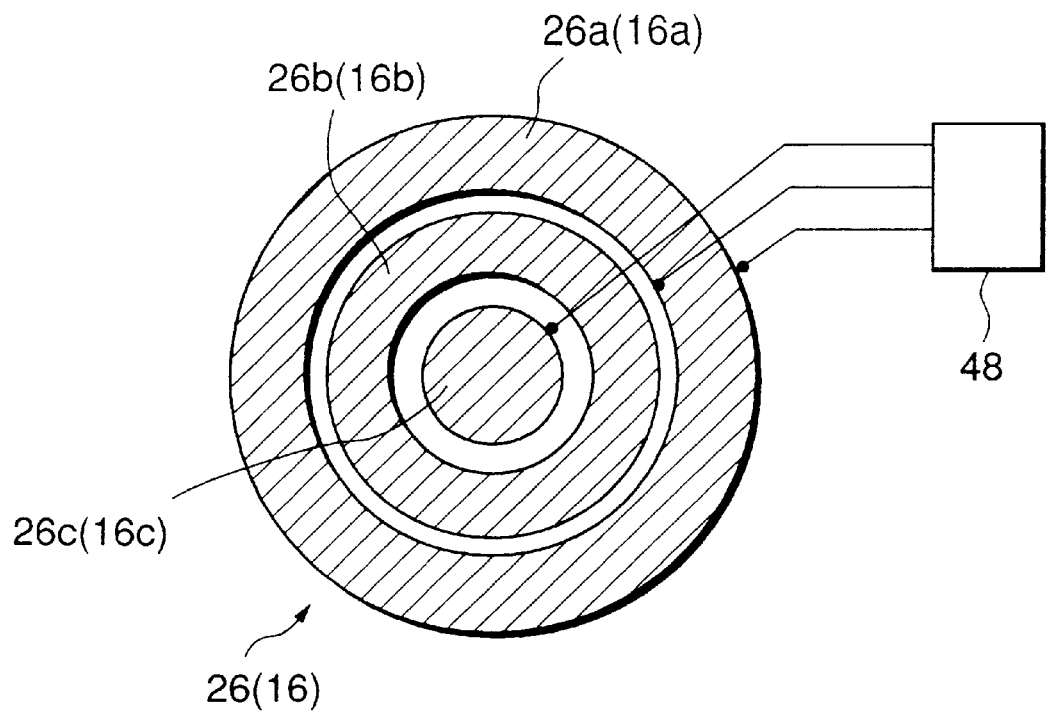
FIG. 3 is a plan view of the heating means provided in the thermal processing apparatus of FIG. 2.

Each of the upper and lower heaters 26 and 16 is divided into a plurality of concentric circular zones, such as three zones 26a (16a), 26b (16b), and 26c (16c), as shown in FIG. 3, with the configuration being such that power supplied from an electrical power supply source 48 is controlled individually for each of the zones so that power can be supplied separately thereto. Note that the number of zones is not limited to three; it could equally well be two or four or more.

As shown in FIG. 2, a uniform-heating ring member 50 made of a material such as quartz is provided on a peripheral edge portion of the holder 14 for the object to be processed within the processing vessel 4 in such a manner as to cover a side portion of the wafer W supported thereon (see also FIG. 4), with the configuration being such that the wafer W is heated by radiant heat reflected therefrom and, at the same time, a thermal insulation function is exhibited with respect to the side walls of the processing vessel 4. A circular-arc-shaped portion corresponding to the gate valve G1 on one side of this uniform-heating ring member 50 is cut out and separated from the main unit side thereof as a shutter portion 50A, and a shutter rod 52 provided penetrating through the base portion of the processing vessel 4 is connected to this shutter portion 50A. An expandable metal bellows 54 that permits vertical movement while maintaining an airtight seal is provided on the penetrating portion of this shutter rod 52, whereby this shutter portion 50A is enabled to move vertically by an elevator mechanism 53 when the wafer is conveyed in or out. This shutter portion 50A is moved vertically in synchronization with the opening and closing of the gate valve G1.

Figure 5:
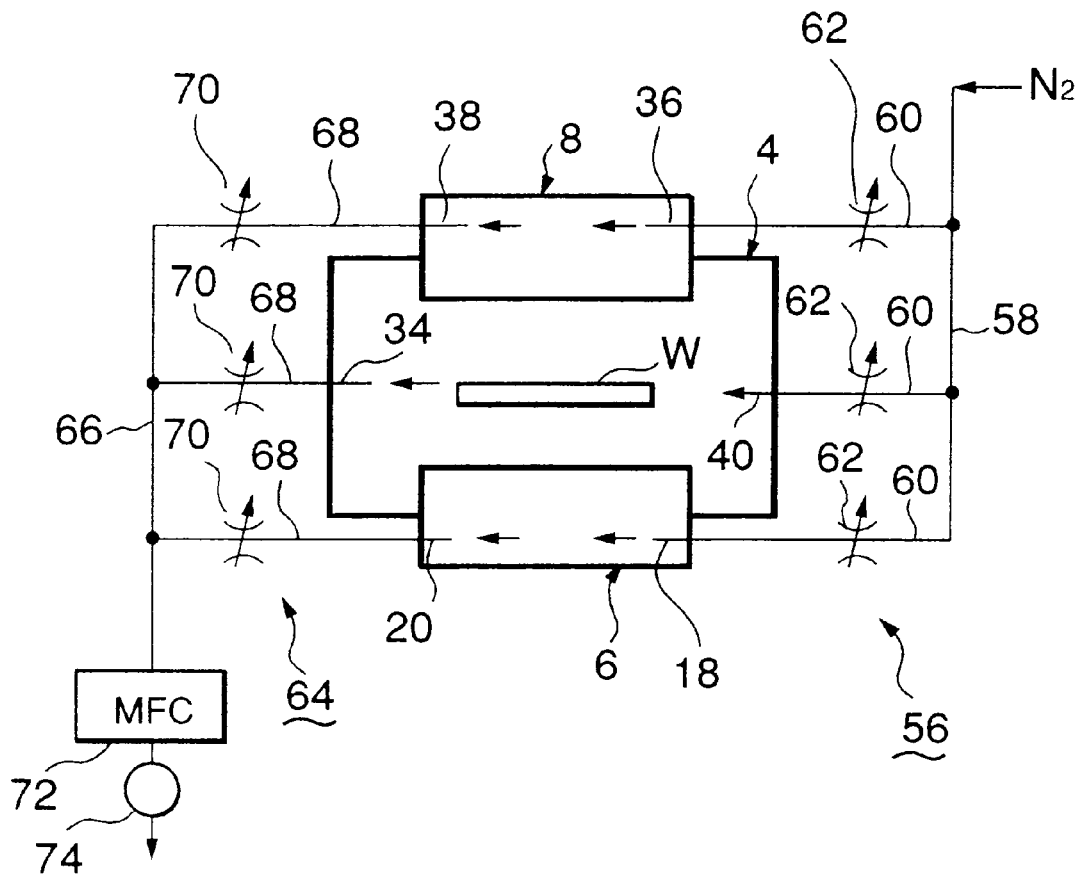
FIG. 5 is a schematic view of a gas supply system and a gas exhaust system.

The gas supply system and gas exhaust system within the processing vessel 4 for controlling the pressures within the lower and upper heating means vessels 6 and 8 are configured as shown in FIG. 5. In other words, a gas supply system 56 for supplying a purge gas such as $N_2$ has a common gas passageway 58 for connection in common to the purge gas introduction ports 40, 18, and 36, and this is connected to the purge gas introduction ports 40, 18, and 36 by branch pipelines 60 that branch therefrom. A supply-side fixed needle valve 62 that opens at a predetermined pressure between upstream and downstream sides thereof is inserted into each of these branch pipelines 60, with the configuration being such that an $N_2$ supply is provided therethrough without any large difference in pressures being created between the vessels when $N_2$ is supplied to return the pressure to atmospheric pressure, for example.

In addition, a gas exhaust system 64 for exhausting environmental gas within the vessels has a common gas passageway 66 for connection in common to the gas exhaust port 34 of the processing vessel 4 and the purge gas exhaust ports 20 and 38 of the lower and upper heating means vessels 6 and 8, and this is connected to the gas exhaust port 34 and the purge gas exhaust ports 20 and 38 by branch pipelines 68 that branch therefrom. An exhaust-side fixed needle valve 70 that opens at a predetermined pressure between upstream and downstream sides thereof is inserted into each of these branch pipelines 68, with the configuration being such that environmental gas is exhausted therethrough without any large difference in pressures being created between the processing vessel and the other vessels when the processing vessel is evacuated, for example.

A mass-flow controller 72 and a vacuum pump 74 are also inserted in the common gas passageway 66 for exhaust, to ensure that fixed amounts of gas are exhausted at a time during the exhaust process.

The operation of the thus configured embodiment of the present invention will now be described.

First of all, a wafer W held by the conveyor arm 44 of the load-lock chamber 42 is conveyed into the processing vessel 4 through the opened gate valve G1 by extending the arm 44, then the arm 44 is lowered through a very small distance to transfer the wafer W onto the holder 14 for the object to be processed within the processing vessel 4. The arm 44 is then contracted, the gate valve G1 is closed, and the interior of the processing vessel 4 is sealed.

The interior of the processing vessel 4 is evacuated to a predetermined processing pressure and also a processing gas is supplied in a shower from the gas supply head 28 thereinto, to maintain this processing pressure. Simultaneously therewith, power is supplied to the resistance heaters 16 and 26 accommodated within the lower and upper heating means vessels 6 and 8, or the power supplied thereto is increased, so that the wafer W mounted on the holder 14 is heated from both sides and is maintained at the processing temperature, and a predetermined process is performed thereon. In this case, the upper and lower resistance heaters 26 and 16 control the supply of power to each zone individually, in such a manner that the interior of the wafers surface is heated uniformly.

When chemical vapor deposition (CVD) is performed as the thermal processing by way of example, a mixture such as silane and hydrogen is used as the processing gas, argon is added as the carrier gas, the processing pressure is set on the order of 0.5 Torr, and the processing temperature is set on the order of 1050° C.

In order to heat the wafer W in this case, the upper and lower resistance heaters 26 and 16 are disposed above and below the wafer W and also the heaters 26 and 16 are enclosed within the quartz heating means vessels 8 and 6, respectively, so that the wafer can be heated from both sides without causing contamination of the wafer. This ensures that the wafer is heated rapidly and also with a very uniform internal temperature. As a specific result of making the thin portions 8A and 6A of the heating means vessels 8 and 6 of this embodiment protrude in a convex manner into the processing vessel 4, with the heaters 26 and 16 disposed on inner surfaces thereof, the wafer surfaces and heater surfaces are placed as close together as possible so that the distances therebetween are extremely small, thus making it possible to further improve the uniformity of temperature within the wafer surfaces, even with a larger wafer.

Since the thickness of the quartz thin portions 8A and 6A is set to be extremely thin at approximately 4 mm, thermal response is superior because thermal losses from these portions are small and also their thermal capacity is small, so that the temperature of the wafer W can be controlled with good responsiveness.

By forming the gas supply head 28 to be flat and disposing it directly under the upper resistance heater 26 and also directly above the holder 14 for the object to be processed, as shown in FIG. 2, the upper resistance heater 26 can be positioned in the vicinity of the upper surface of the wafer W so that heating is performed at a high energy, moreover the processing gas can be supplied uniformly and directly over the wafer W, and the formation of unwanted films on components such as the processing vessel can be prevented.

Since each of the resistance heaters 26 and 16 is divided into a plurality of concentric circular zones, as shown in FIG. 3, and the supply of power to each of these zones can be controlled individually, the wafer temperature can be controlled minutely.

Since the uniform-heating ring member 50 is provided at the peripheral portion of the wafer W so as to cover it, and thus the wafer W can also be heated by reflected radiant heat therefrom, not only can the surface uniformity of the wafer temperature be improved even further, but also the leakage of heat into the processing vessel is reduced so that the thermal efficiency can be improved by that much. The provision of the uniform-heating ring member 50 in this manner enables a hot-wall function thereof, it is therefore possible to ensure that the formation of unwanted films that adhere to the inner wall surfaces of the processing vessel in the prior art are made to adhere to the readily cleanable uniform-heating ring member 50 instead of the inner wall surfaces of the vessel, making it easy to perform maintenance such as cleaning.

Since resistance heaters 16 and 26 of a high heat value are used in this case, the wafer can be heated to a high temperature of 1000° C. or more. Note that halogen lamps could be used instead of these heaters.

It could be considered that pressure changes within the processing vessel 4 could lead to pressure differences between that vessel and the heating means vessels 8 and 6 thereabove and therebelow, but since the configuration is such that the pressures within both the upper and lower heating means vessels 8 and 6 are made to vary to follow the pressure within the processing vessel 4, so there is not damage to the partitioning walls between these vessels. This will now be described with reference to FIG. 5.

As previously mentioned, fixed needle valves 62 and 70 are provided in the branch pipelines 60 and 68 of the gas supply system 56 and gas exhaust system 64, respectively, with their configuration being such that the degree of opening thereof varies automatically with the pressure difference between the upstream and downstream sides thereof.

Figure 6A:
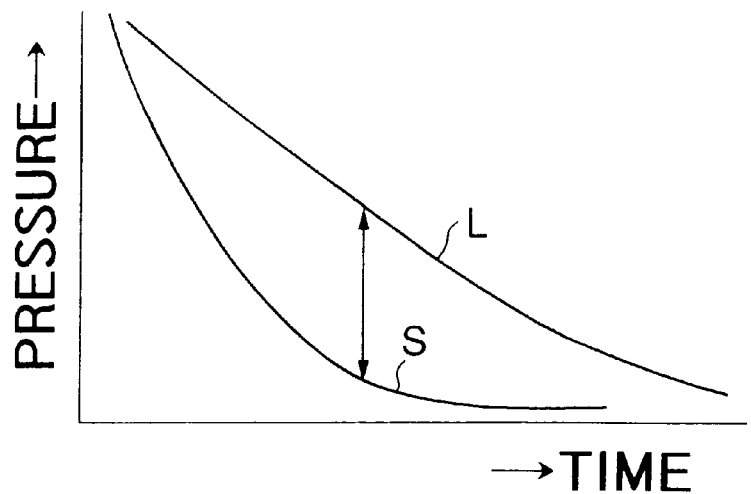
FIGS. 6A and 6B are graphs of pressure changes within the processing vessel and heating means vessel of the prior art and the present invention, respectively.
Figure 6B:
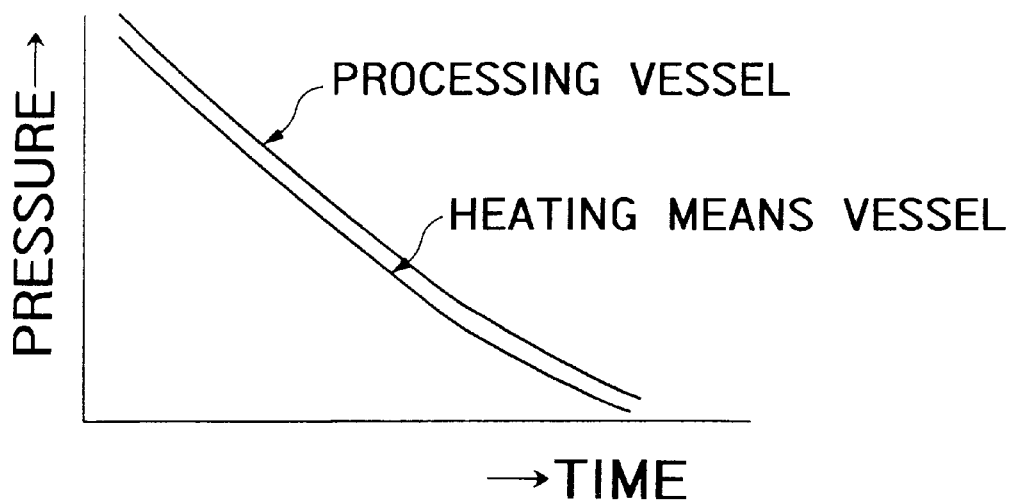

The description first concerns the state during evacuation wherein, in general, if two vessels of different capacities are evacuated individually at the same flowrate, the pressure within the larger-capacity vessel drops gently as shown by the curve L in FIG. 6A, but the pressure within the smaller-capacity vessel drops abruptly as shown by the curve S, causing a large pressure difference between the two vessels. However, if the exhaust-side fixed needle valves 70 are inserted into the branch pipelines 68 and if the evacuation is done at a constant flowrate such as several liters per minute under the control of the mass-flow controller 72, as in the apparatus of this invention, the operation of the fixed needle valves 70 ensures that the atmosphere within the large-capacity processing vessel 4 is evacuated at a large rate with respect to the small quantity by which the atmosphere within the small-capacity upper and lower heating means vessels 8 and 6 is evacuated and, as a result, the pressure within the heating means vessels 6 and 8 changes so as to follow the pressure within the processing vessel 4, as shown in FIG. 6B, and thus the evacuation occurs with the pressure differences between the processing vessel 4 and the heating means vessels 6 and 8 being maintained in a state in which they are extremely small.

A similar state occurs when purging with $N_2$ to return the interior of the vessels to atmospheric pressure, such that, when $N_2$ is supplied, the $N_2$ is supplied while the pressure differences between the vessels are kept extremely small, as a result of the insertion of the fixed needle valves 62 in the branch pipelines 60 of the gas supply system 56 shown in FIG. 5. Therefore, the pressure differences between the processing vessel 4 and the heating means vessels 6 and 8 become extremely small, such as on the order of 10 Torr. This means that the thin portions 6A and 8A that separate the vessels need only be as thin as approximately 4 mm, as previously mentioned, making it possible to suppress thermal losses and improve the thermal response. Note that the thick-plate lid portions 6B and 8B that are exposed to atmospheric pressure are formed to a thickness that enables them to resist atmospheric pressure.

Wafer temperature profiles were obtained by simulation for a case in which a wafer was subjected to single-surface heating and a case in which a wafer was subjected to two-surface heating, by disposing heating means on both sides of the wafer in accordance with the present invention, with the results being as discussed below.

Figure 7A:
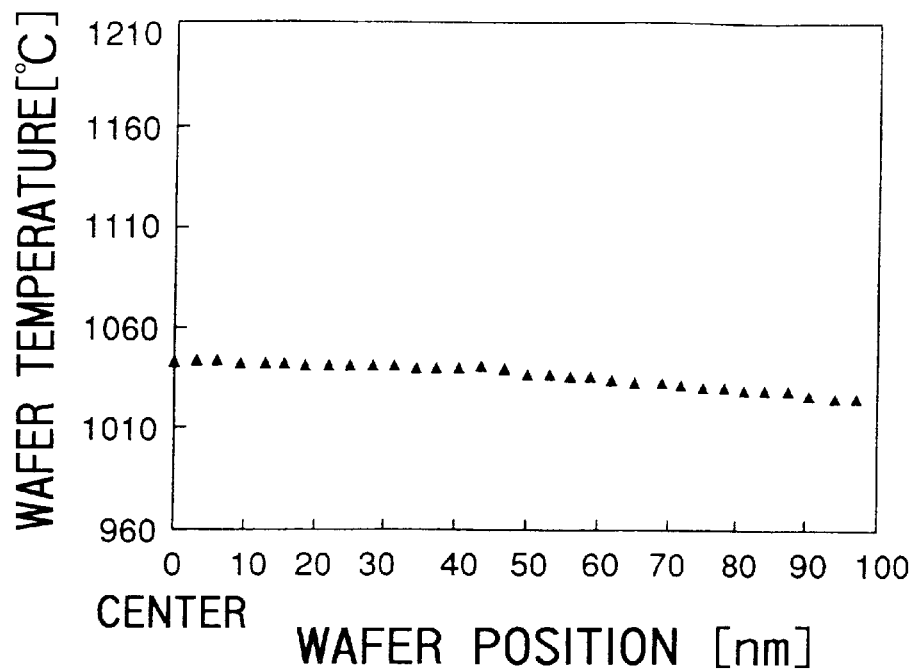
FIGS. 7A and 7B are graphs of the temperature profiles within the surface of the object to be processed, for the single-surface heating of the prior art and the double-surface heating of this invention.
Figure 7B:
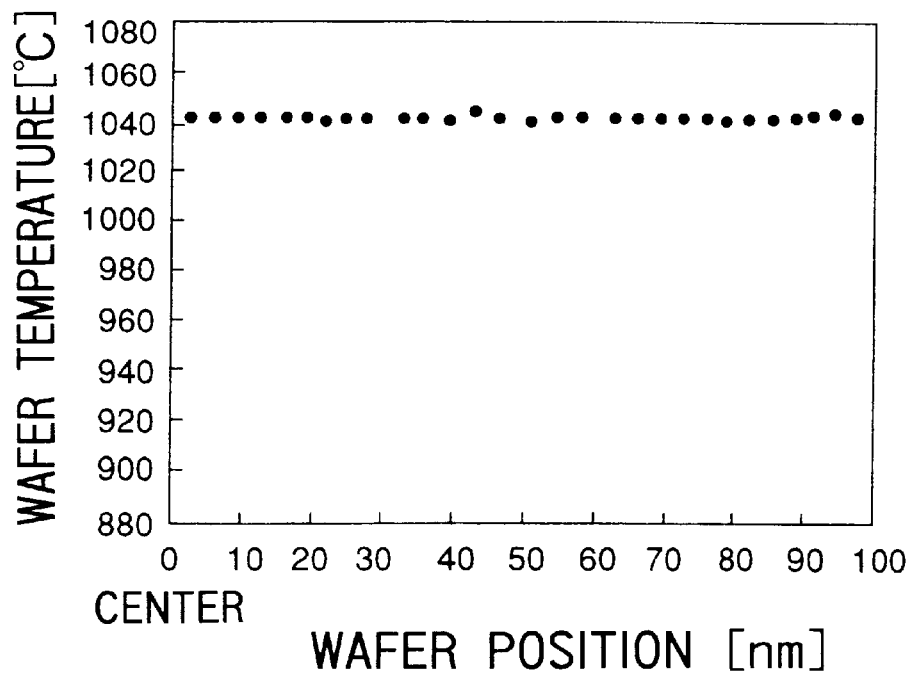

The wafer temperature profile obtained for the prior-art single-surface heating is shown in FIG. 7A and the wafer temperature profile obtained for two-surface heating in accordance with the present invention is shown in FIG. 7B. In each case, the heaters were divided into two zones and the setting temperature was 1040° C.

With the single-surface heating shown in FIG. 7A, the temperature dropped slightly closer to the peripheral portion of the wafer, so that a temperature difference on the order of 10° C. occurred between that portion and the central portion thereof, the uniformity of temperature within the surface was not very good, and moreover a rated power of 7 kW or more had to be applied to the heater in the outer zone during this time. In contrast thereto, with the two-surface heating shown in FIG. 7B, there was substantially no temperature difference between the central portion and peripheral portion of the wafer, and the uniformity of the temperature within the surfaces could be maintained at a high level. Moreover, the power used overall was slightly greater than in the single-surface heating case, but the power applied to the heater in each zone was completely within the rated value.

Figure 4:
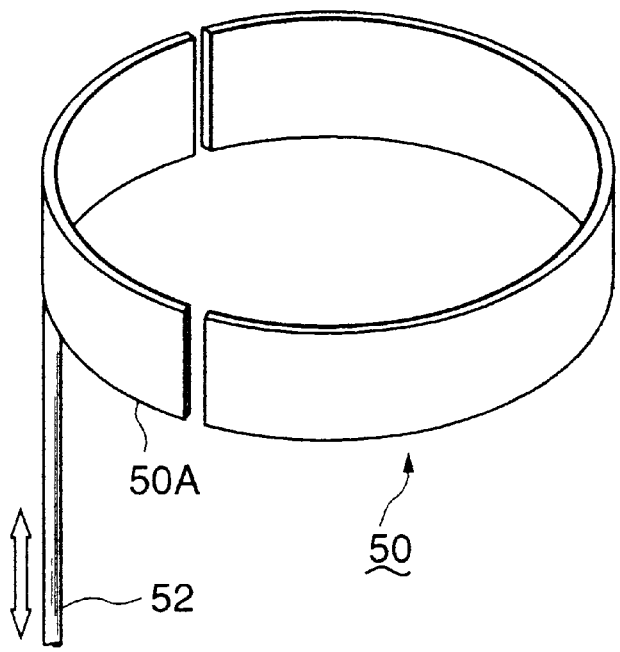
FIG. 4 is a perspective view of a uniform-heating ring member.
Figure 8A:
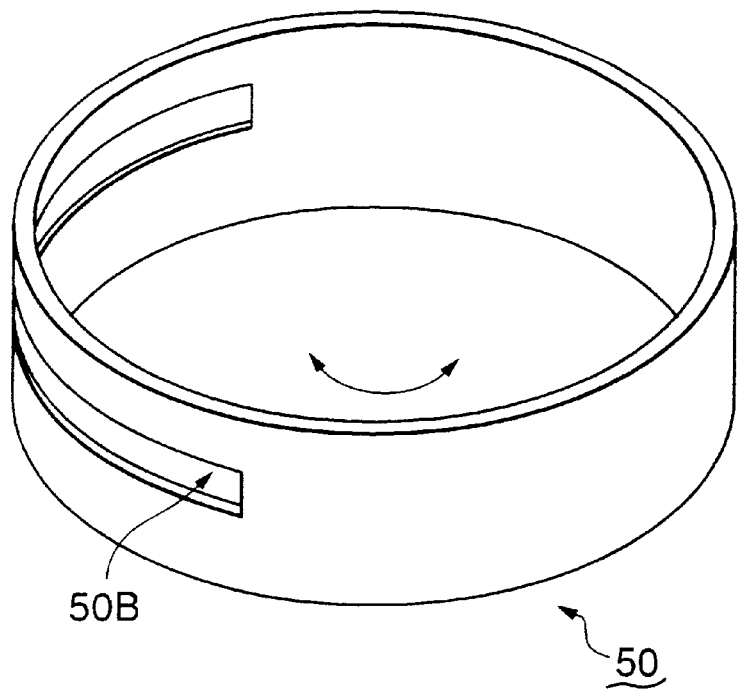
FIGS. 8A and 8B show different variants of the uniform-heating ring member.

The uniform-heating ring member 50 having the shutter portion 50A that can be raised and lowered to protect the gate valve G1 from heat is provided in the above embodiment, as shown in FIG. 4, but instead it is also possible to use a uniform-heating ring member 50 wherein the center of one side surface thereof is provided with a slit-shaped aperture 50B of a size that allows the wafer W to pass therethrough, as shown in FIG. 8A. In that case, the configuration could be such that the component is made to be rotatable, so that the uniform-heating ring member 50 can be rotated through approximately 180 degrees after the wafer W has been conveyed in or out, to protect the gate valve from heat.

Figure 8B:
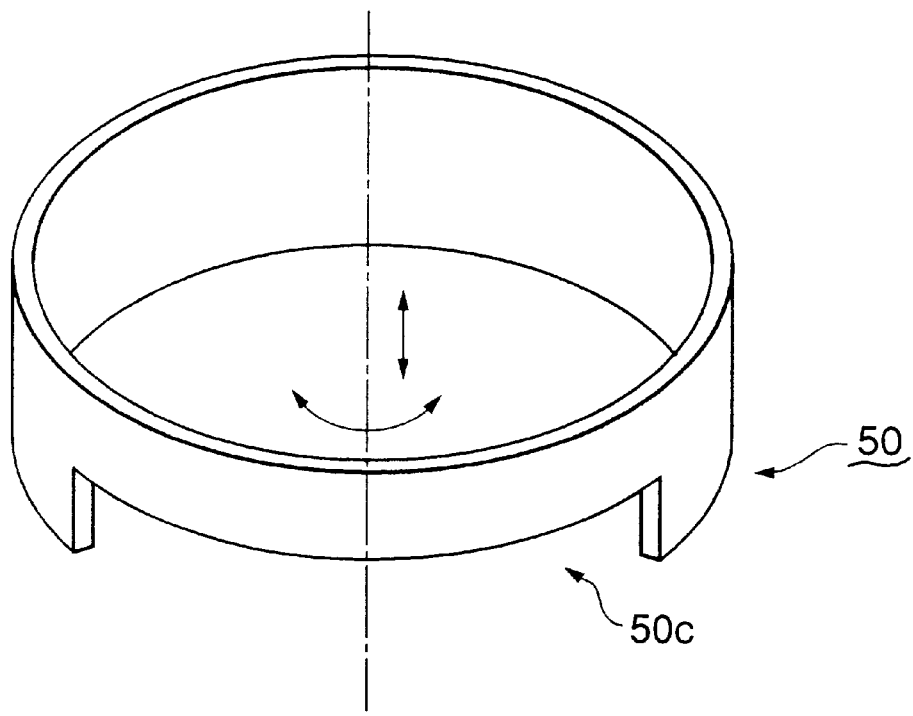

Instead of the above configuration, a uniform-heating ring member 50 could be used in which a concave cutout 50C of a size that allows the wafer W to pass therethrough is provided in a lower portion of one side surface thereof, as shown in FIG. 8B. In that case, the uniform-heating ring member 50 could be made rotatable or elevatable, so that the uniform-heating ring member 50 can be rotated through approximately 180 degrees or moved downward after the wafer W has been conveyed in or out, to protect the gate valve from heat.

Figure 9:
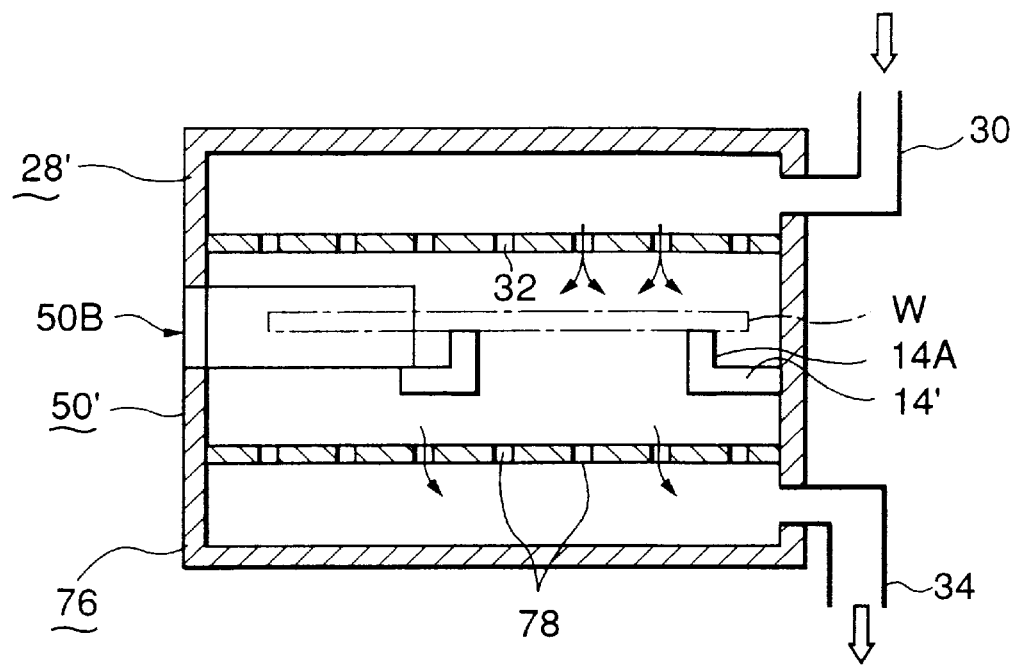
FIG. 9 is a vertical sectional view through a variant of the thermal processing apparatus in which the internal structural members are integrated.
Figure 10:
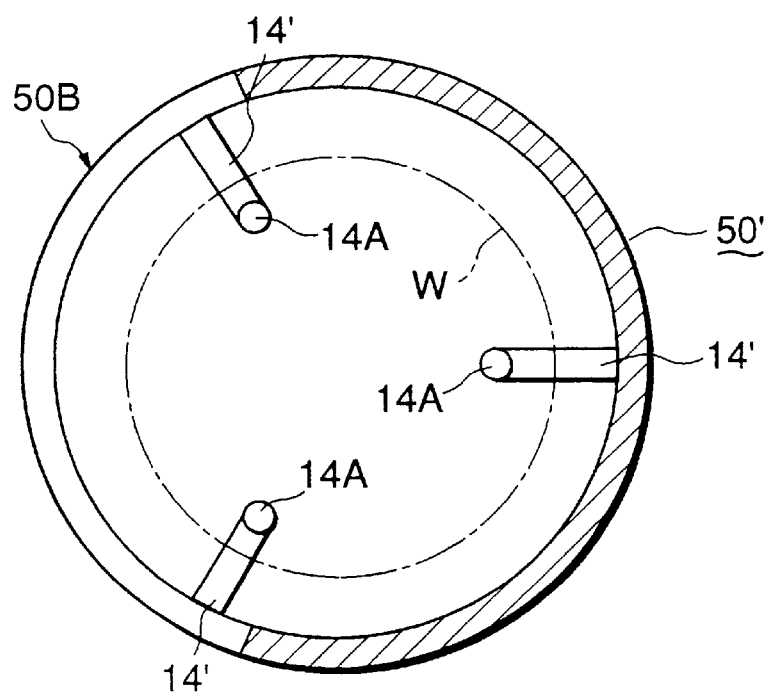
FIG. 10 is a horizontal sectional view through the integrated internal structural members of FIG. 9.
Figure 11:
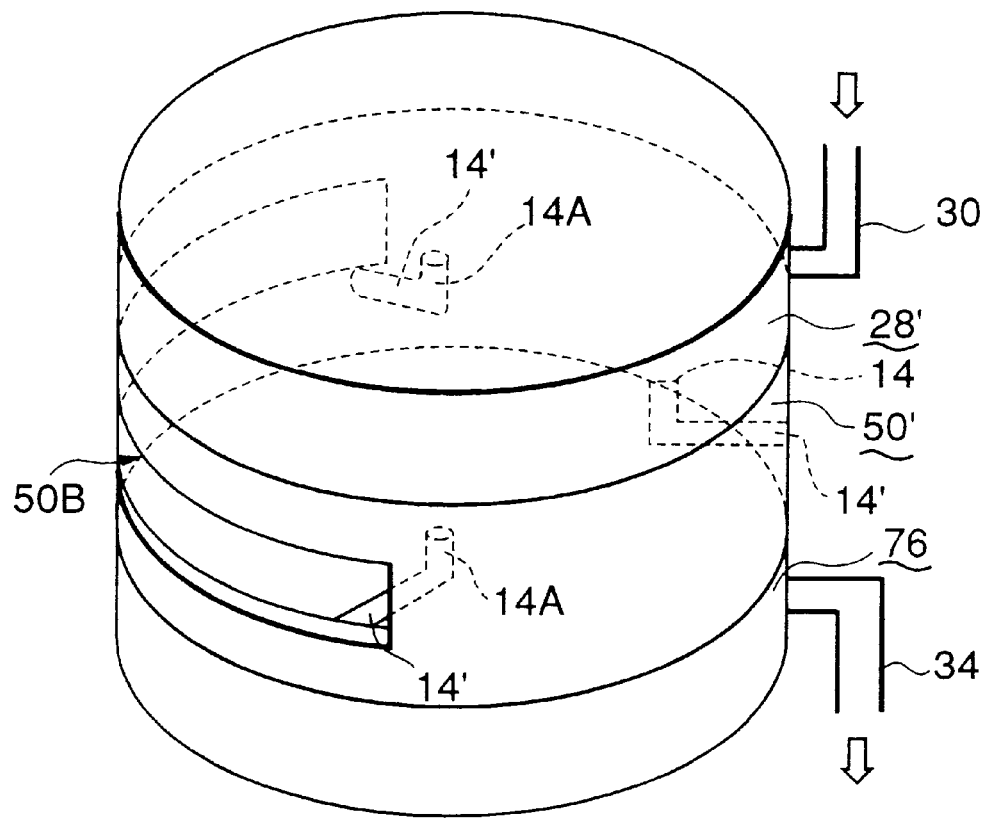
FIG. 11 is a perspective schematic view of the integrated internal structural members of FIG. 9.

In addition, the above configuration was such that the gas supply head 28 of a shower-head structure, the uniform-heating ring member 50, and the holder 14 for the object to be processed were provided separately and independently, but instead a completely integral structure could be used in which the gas ejection holes are formed as a gas exhaust head 76 of a configuration similar to that of the shower-head structure, as shown in FIGS. 9 to 11. In other words, a gas supply head 28' of a shower-head structure is linked to a uniform-heating ring member 50' of the configuration shown in FIG. 8A, and a holder 14' for the object to be processed, which has three claw portions 14A attached thereto, protrudes towards the center from side wall surfaces of this uniform-heating ring member 50'. The gas exhaust head 76 has a shower-head structure similar to that of the gas supply head 28 shown in FIG. 2 which is provided with a large number of suction holes 78 for sucking in gases in the upper surface thereof, and a gas exit port thereof could be connected to the gas exhaust port 34. This makes it possible to form it integrally of a material such as quartz.

The above configuration ensures that a processing gas supplied from the gas supply head 28 towards the wafer W therebelow flows in such a manner that it strikes this surface then is made to flow laterally outwards in the radial direction by the inner surfaces of the uniform-heating ring member 50', until it is sucked into the gas exhaust head 76 thereunder. Therefore, the processing gas flows in such a manner that it strikes the wafer surface efficiently without expanding outward as far as the peripheral portions of the interior of the processing vessel 4, and thus usage efficiency of the processing gas can be increased.

In addition, when an unwanted film has formed on this integral structure, the integral structure alone can be cleansed, so that maintenance work can be performed efficiently.

Figure 12:
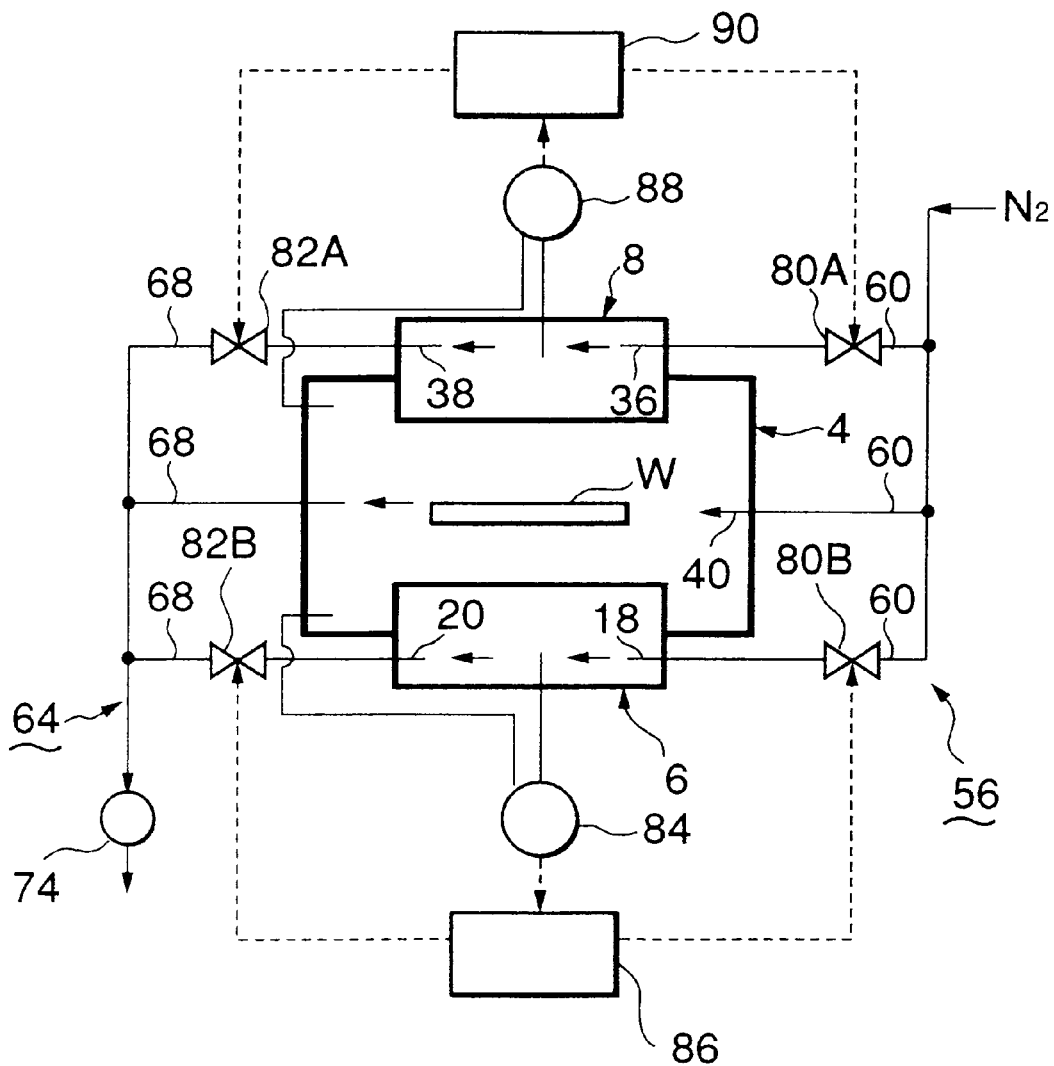
FIG. 12 shows a variant of the gas supply system and gas exhaust system.

In the above embodiment, the fixed needle valves 62 and 70 are provided in the gas supply system 56 and gas exhaust system 64, as shown in FIG. 5, to control the pressure differences between the vessels, but the present invention is not limited thereto and a configuration such as that shown in FIG. 12 could equally well be used. In other words, flowrate control valves 80A, 80B, 82A, and 82B with a degree of opening that can be freely controlled are provided within the branch pipelines 60 and 68 of the gas supply system 56 and gas exhaust system 64, instead of needle valves in the branch pipelines 60 and 68 connected to the heating means vessels 6 and 8, but not such valves are provided in the branch pipeline 60 connected to the processing vessel 4. In addition, a first pressure difference measurement portion 84 is provided for detecting a pressure difference between the processing vessel 4 and the interior of the lower heating means vessel 6 therebelow, and a first valve opening control portion 86 controls the flowrate control valves 80B and 82B on the supply side or exhaust side of the lower heating means vessel 6 on the basis of the thus detected pressure difference.

Similarly, a second pressure difference measurement portion 88 is provided for detecting a pressure difference between the processing vessel 4 and the interior of the upper heating means vessel 8 thereabove, and a second valve opening control portion 90 controls the flowrate control valves 80A and 82A on the supply side or exhaust side of the upper heating means vessel 8 on the basis of the thus detected pressure difference.

This configuration ensures that the degrees of opening of the flowrate control valves 82A and 82B on the exhaust side are controlled during the evacuation process in such a manner that the detected values of the pressure difference measurement portions 84 and 86 are maintained within the pressure-resistant range of the thin portions 6A and 8A, such as within ±10 Torr. Similarly, the degrees of opening of the flowrate control valves 80A and 80B on the supply side are controlled during the purging with $N_2$ to return the interior of the processing vessel 4 to atmospheric pressure, in such a manner that the detected values are maintained within ±10 Torr. Therefore, an operative effect similar to that of the configuration of FIG. 5 can be obtained in this embodiment as well.

Note that this embodiment was described as relating to the performance of film formation by CVD as the thermal processing, by way of example, but it is not limited thereto and can of course be applied to other forms of thermal processing such as oxidation, diffusion, or annealing.

In this case, the gate valve G1 is provided on only one side of the processing vessel 4 and the wafer is conveyed in and out therethrough, but another gate valve could be provided at a position opposite thereto so that the entrance port and exit port for the wafer are separate. In such a case, two of the shutter portions 50A or the like are provided for the uniform-heating ring member 50, in correspondence thereto.

Furthermore, the object to be processed is not limited to a semiconductor wafer W; it could equally well be a glass substrate or an LCD substrate.

The thermal processing apparatus of the above described embodiment makes it possible to achieve the superlative operational effects described below.

Since heating means is disposed on both sides of the object to be processed, to enable two-surface heating, the uniformity of temperature within the surfaces thereof can be greatly improved, even when the size of the object to be processed is increased.

In addition, by accommodating each heating means in a heating means vessel and allowing the pressure therein to vary to follow pressure changes within the processing vessel, to keep pressure differences between the vessels small, the partitioning walls that separate the vessels can be made thin so that, not only can the thermal efficiency be increased by that amount and thus the uniformity of the surface temperature of the wafer can be improved, but also the thermal response thereof can be made better.

Furthermore, covering the side portion of the object to be processed by the uniform-heating ring member ensures that the amount of heat radiating to the exterior can be reduced, increasing the thermal efficiency, and also the uniformity of the surface temperature can be improved by that amount. This uniform-heating ring member also makes it possible to form a local hot-wall configuration so that unwanted films can be prevented from attaching to the side walls of the processing vessel, which also facilitates maintenance.

Integrating the gas supply head, the uniform-heating ring member, the holder for the object to be processed, and the gas exhaust head into a single structure reduces the amount of processing gas leaking into the side portions, which not only makes it possible to improve the usage efficiency of the processing gas, it also facilitates maintenance further.

Figure 13:
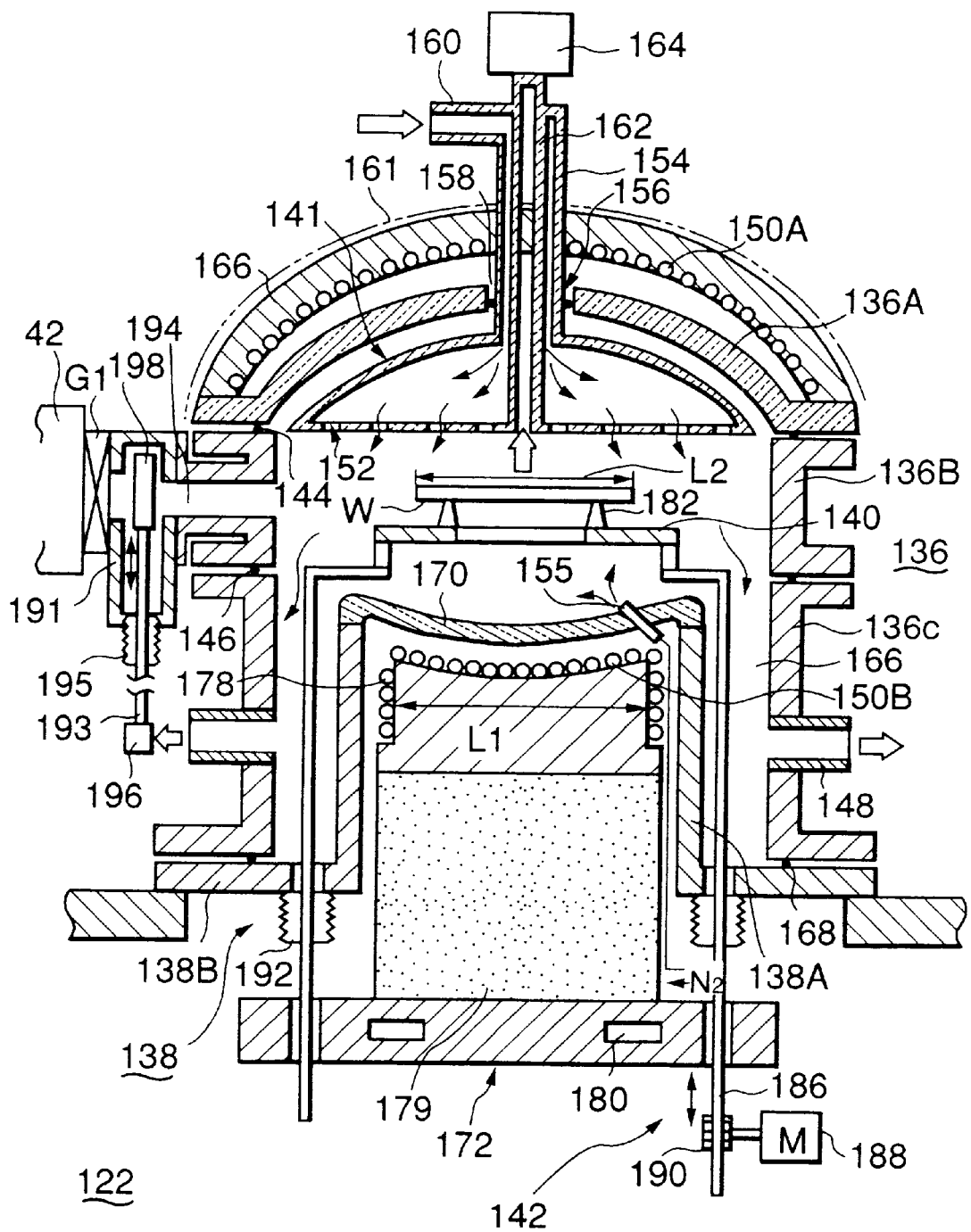
FIG. 13 is a vertical sectional view through a second embodiment of the single-wafer thermal processing apparatus of the present invention.

A second embodiment of the thermal processing apparatus in accordance with this invention will now be described with reference to FIG. 13. As shown in this figure, a thermal processing apparatus 122 is mainly configured of a cylindrical processing vessel 136 formed of highly-pure quartz; an upwardly convex inserted base portion 138 of highly-pure quartz which is inserted into an aperture in a base portion of the processing vessel 136 to seal the interior of the processing vessel; resistance heating means 150A and 150B provided on a ceiling portion side and the inserted base portion 138 side of the processing vessel 136, respectively; a holder 140 for holding a wafer W that is the object to be processed; a gas supply head 141 that introduces a processing gas into the processing vessel; and a position adjustment means for adjusting the heightwise position of the holder 140.

The processing vessel 136 is configured of a ceiling portion 136A that covers an upper portion thereof; an annular center vessel portion 136B connected thereto with a sealing member 144 such as an O-ring therebetween; and a cylindrical lower vessel portion 136C connected thereto with a sealing member 146 such as an O-ring therebetween. A gas exhaust port 148 connected to a vacuum exhaust system (not shown in the figure) is provided in a side wall of the lower vessel portion 136C so that the interior thereof can be evacuated.

The ceiling portion 136A is formed of transparent quartz through which heat waves can pass, and it is also formed to be curved in a dome shape so as to enable resistance to atmospheric pressure when the interior of the vessel is in a vacuum state, so that it can exhibit a predetermined strength even when the thickness thereof is small. The gas supply head 141 is provided below this ceiling portion 136A in such a manner as to face the holder 140 for the object to be processed. The entire gas supply head 141 is formed of a material that enables the transmission of heat waves, such as highly-pure transparent quartz. This gas supply head 141 is formed in such a manner that the vertical section thereof has a semi-elliptical shape, a large number of gas ejection holes 152 are formed in a lower flat surface thereof, facing into the processing chamber, and also a gas introduction pipeline 154 extends upwards from an upper edge thereof and passes through a hole 156 provided in the ceiling portion 136A, with a sealing member 158 such as an O-ring therebetween to maintain the airtightness thereof.

A gas inlet port 160 is provided in the gas introduction pipeline 154, in such a manner that a predetermined processing gas can be introduced thereby. This gas introduction pipeline 154 has a double-walled structure that accommodates a co-axial temperature measurement tube 162 therein, a lower end of the gas introduction pipeline 154 passes through the gas supply head 141 and opens into the processing vessel, an upper end thereof is sealed by transparent quartz in an airtight manner, and a radiation thermometer 164 for measuring the surface temperature of the wafer is disposed in this upper end. The temperature measurement tube 162 is provided in a direction that is substantially perpendicular to the surface of the wafer W and is configured in such a manner that radiant light from the wafer W can be detected directly by the radiation thermometer 164.

The resistance heating means 150A that is disposed on the ceiling portion 136A side is provided in such a manner as to cover the entire surface of this ceiling portion 136A and is configured to supply thermal energy from above the wafer W. An outer side of this resistance heating means 150A is covered by a dome-shaped insulating member 166 formed of a material such as alumina. An upper surface of this insulating member 166 could be configured to reflect heat waves downward by forming a film 161 of a metal such as aluminum thereof by a method such as vapor deposition.

The resistance heating means 150A and the resistance heating means 150B on the inserted base portion 138 side are formed of a resistance heating wires that enable a high thermal load per unit area, of a material such as molybdenum disilicide.

The ceiling portion 136A is formed of transparent quartz because of the necessity of allowing heat waves to pass therethrough, but the center vessel portion 136B and lower vessel portion 136C that do not necessitate the passage of heat waves therethrough are formed of, for example, an opalescent non-transparent quartz wherein air bubbles are comprised, so that the components themselves are formed as light-blocking members.

The quartz inserted base portion 138 consists of a hollow convex inserted portion 138A of a diameter such that it is set to be somewhat smaller than the inner diameter of the lower vessel portion 136C, with an outer diameter set so as to ensure the formation of a downward exhaust passageway 166 of a predetermined width, and a ring-flange-shaped base plate 138B provided in a lower end thereof and forming an airtight seal with a lower aperture of this convex inserted portion 138A with a sealing member 168 such as an O-ring therebetween. The lower end of the convex inserted portion 138A is open and an optically transmissive plate 170 at an upper edge thereof is positioned directly below the holder 140 for the object to be processed and is formed to be curved in a downward concave shape; it exhibits a predetermined strength although it is thin enough to be of the same thickness of the ceiling portion 136A. The material of a leg portion of the convex inserted portion 138A is formed of, for example, an opalescent non-transparent quartz wherein air bubbles are comprised, so that the component itself is formed as a light-blocking member.

Figure 15:
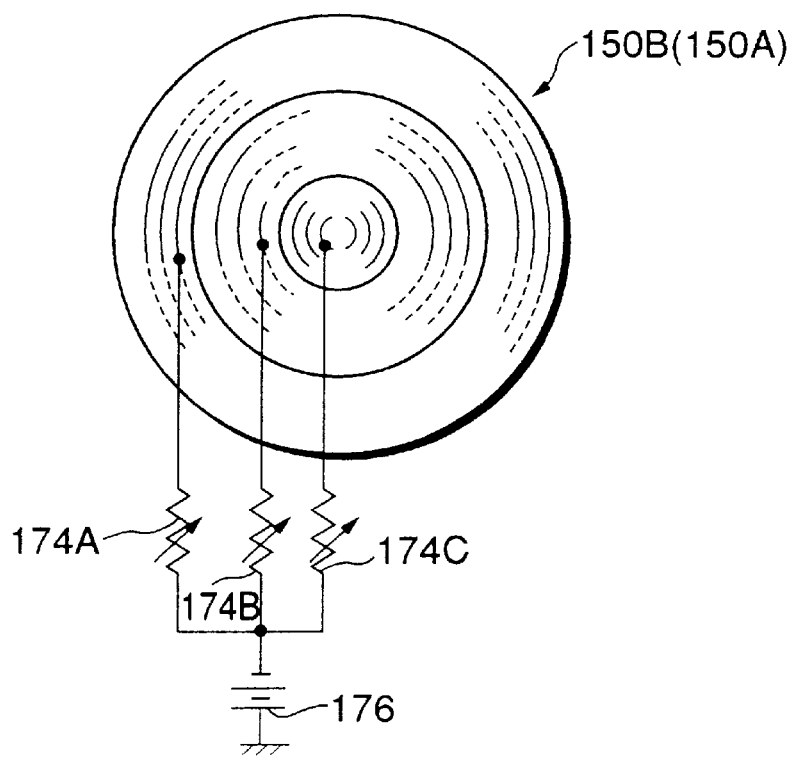
FIG. 15 is a view of the resistance heating means used in the thermal processing apparatus of FIG. 13.

A heater stand 172 is inserted from below into the convex inserted portion 138A that is opened at a lower end, an upper end thereof is formed in a concave curve and the resistance heating means 150B formed of a material such as molybdenum disilicide is mounted thereon, thus ensuring that the wafer W is heated from below. In this case too, the resistance heating means 150B is formed of resistance heating wires of a material such as molybdenum disilicide that are wound in a circular concentric manner, and it is divided into a number of concentric zones, such as three zones in the example shown in FIG. 15. Individual control of each of these zones can be applied in a similar manner to the resistance heating means 150A of the ceiling portion 136A. This ensures that the energy aimed at the wafer W can be controlled in each zone.

The diameter L1 of this lower resistance heating means 150B is set to be within the range of 1.2 to 1.5 times the diameter L2 of the wafer W, so that a sufficient quantity of energy can be aimed at the peripheral portions of the wafer W, where the quantity of radiant heat tends to be greater than at the center. A side portion heater 178 is provided on an upper side wall of the heater stand 172 for heating the leg portion of the convex inserted portion 138A, so that the leg portion is heated thereby.

The heater stand 172 is formed of a material such as stainless steel with an insulating member 179 of, for example, alumina interposed midway, a cooling jacket 180 is provided at a lower end portion thereof, and the temperature of that portion is lowered to a safe temperature.

A gas introduction nozzle 155 for supplying an inert gas for gas purging, such as $N_2$, is provided in the optically transmissive plate 170, so that processing gas is prevented from circulating to the rear side of the wafer W by the introduction of $N_2$ therethrough.

Figure 14:
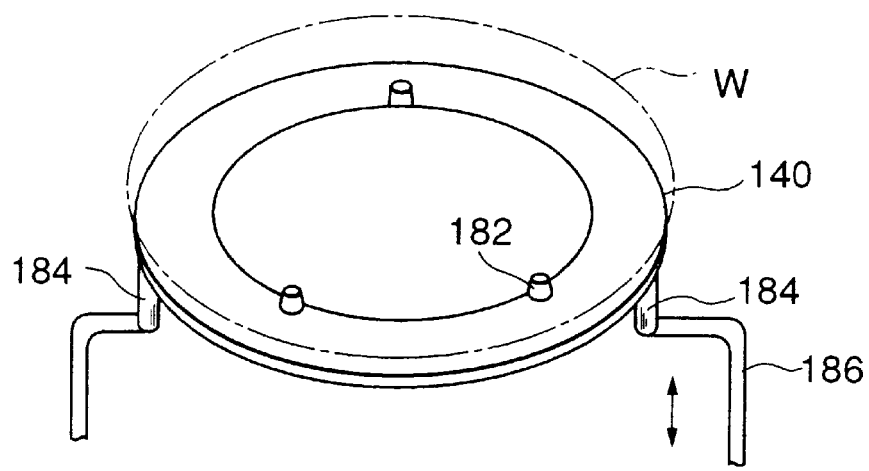
FIG. 14 is a perspective view of the holder for an object to be processed used in the thermal processing apparatus of FIG. 13.

The holder 140 on which the wafer W is mounted is also shown in FIG. 14; it is formed of highly-pure transparent quartz or SiC, it comprises an annular plate member of a diameter slightly greater than that of the wafer W, and a plurality of protrusions 182, such as three protrusions 182, are formed equidistantly in the peripheral direction on upper surface of an inner peripheral side thereof, to support the rear surface of the wafer W. In this case, the support positions of the wafer W are not on the peripheral edge of the wafer, but they are arranged at positions such that the support thereof is a certain distance closer to the wafer center, to ensure that the amount of deformation of the wafer itself during the thermal processing is controlled.

A plurality of leg portions 184, such as two leg portions 184, are formed on a rear surface side of the holder 140 arrayed in the diametric direction of the holder 140, and these leg portions 184 are connected to position adjustment rods 186 made of a material such as highly-pure quartz.

These position adjustment rods 186 are formed as part of a heightwise position adjustment means 142, lower portions thereof are provided so as to pass in a freely movable manner vertically through holes formed in the base plate 138B, and lower ends thereof are provided with gear mechanisms such as rack-and-pinion mechanisms that are driven by a motor 188 in such a manner that the position adjustment rods 186 are forced to move very slightly in the vertical direction to adjust the height of the holder 140. The portions of the position adjustment rods 186 that pass through the base plate 138B are each provided with a freely expandable bellows 192 to permit the adjustment motion of the rods 186 while maintaining the airtightness of the vessel.

A connection port 194 connected to the load-lock chamber 42 is provided in one side portion of the center vessel portion 136B of the processing vessel 136, and a thermal screening box 191 is maintained in an airtight manner in this connection port 194. Within this box 191 is provided a thermal screening plate 198 that is moved vertically by an elevator mechanism 196 in such a manner as to shut off a passageway linking the connection port 194 to the load-lock chamber 42, to restrain the amount of heat transferred to the gate valve G1 side. A bellows 195 is also provided around a rod 193 of this elevator mechanism 196, to maintain the airtightness of the vessel.

The operation of the thus configured second embodiment will now be described.

First of all, an unprocessed semiconductor wafer W is brought into the load-lock chamber 42 through the gate valve G2 (see FIG. 1) by the conveyor arm 44, the interior thereof is evacuated to a predetermined pressure, then the wafer is conveyed through the gate valve G1 into the processing vessel 136, which is maintained the previously set vacuum state, and is transferred to the holder 140. This transfer of the wafer W could be done by causing the motor 188 of the heightwise position adjustment means 142 to operate in the normal direction, to move the holder 140 in the vertical direction, or the conveyor arm 44 itself could be made movable in the heightwise direction (Z direction) to cause it to move vertically.

This transfer causes the rear surface of the wafer W to be supported by the protrusions 182 provided in the holder 140.

The interior of the processing vessel 136 has previously been heated to a certain degree, such as to 200 to 800° C., by the resistance heating means 150A and 150B disposed at the top and bottom thereof, or it is maintained fixed at the processing temperature, then further power is applied after the wafer W has been conveyed thereinto to raise the temperature to the processing temperature of, for example, approximately 1200° C., or the processing temperature is held as is, until the temperature within the wafer surface is uniform. Simultaneously therewith, the interior is held at a predetermined processing pressure while processing gases such as silane and $O_2$ are supplied into the processing vessel 136 from the gas supply head 141, and thermal processing such as film-formation processing is performed. Since a material that is capable of a high load density at a high current, such as molybdenum disilicide, is used for the resistance heating means 150A and 150B, the heating can be done to the predetermined temperature rapidly.

In this case, a thin film is formed on surfaces such as the inner surfaces of the vessels, the surfaces of the gas supply head 141, and the surfaces of the holder 140 for each processing of one wafer W or a plurality of wafers, even if it is only an extremely small amount, so the thermal permittivity from the resistance heating means 150A and 150B changes very slightly, and it can happen that the quantity of heat supplied to the wafer changes. In addition, it can happen that the processing gas supplied from the gas ejection holes 152 of the gas supply head 141 pools above the wafer surface. In such a case, the heightwise position adjustment means 142 is driven to raise or lower the position adjustment rod 186 by a very small amount to raise or lower the holder 140 and thus adjust the height of the wafer, so that the spacing between the gas supply head 141 and the wafer W is adjusted to the optimal position.

In this manner, the temperature of the wafer can be adjusted minutely and also the processing gas can be prevented from pooling above the wafer, making it possible to increase the uniformity of film-formation over the wafer surface. This height-wise positional adjustment of the wafer makes it possible to adjust the height to suit the process, both for a procedure that implements the same thermal processing or for one that implements different types of thermal processing, so that the optimal temperature characteristics can always be achieved. Note that, if heightwise adjustment of the holder is to be done, not only could if be implemented by adjusting the spacing therefrom to the gas supply head, but it could be advantageous to implement it by enabling adjustment of the spacing therefrom to the resistance heating means, but it is also possible to vary the heightwise portion of the gas supply head portion by the heightwise adjustment means instead.

The temperature of the wafer W is measured by the radiation thermometer 164 provided within the ceiling portion 136A, in which case, since light generated upward from the surface of the wafer W is incident directly on the radiation thermometer 164 through the hollow temperature measurement tube 162, there are no obstacles intercepting this light partway, and thus it is possible to detect the temperature of the wafer surface more accurately than by using a thermocouple. Note that the installation position of the radiation thermometer 164 is not limited to the direction perpendicular to the surface of the wafer W, provided it faces the wafer surface directly, and it could be provided at an angle thereabove.

Since the diameter of the upper resistance heating means 150B is set to be within a range that is 1.2 to 1.5 times the diameter of the wafer W, a large amount of energy can be aimed in a concentrated manner on the peripheral portions of the wafer, where the quantity of radiant heat tends to be greater than at the center, and this makes it possible to supplement the quantity of radiant heat and thus maintain a high degree of uniformity of temperature within the wafer surface. Since the surface to which the resistance heating means 150B is attached is formed in a concave shape directed towards the wafer, energy can be supplied more efficiently towards the wafer W. In this case, each of the upper and lower resistance heating means 150A and 150B is configured in such a manner that it is divided into a plurality of concentric zones, such as three zones, and temperature control is possible in each zone, so that the degree of uniformity of surface temperature in the wafer can be increased further by controlling the thermal energy so that it increases towards the outer zone, by way of example.

If the diameter of the resistance heating means 150B were less than 1.2 times the diameter of the wafer W, it would become difficult to aim enough thermal energy at the peripheral portions to match the quantity of radiant heat therein, and thus the uniformity of surface temperature will deteriorate dramatically. If this diameter were greater than 1.5 times, the diameter of the apparatus would become greater than necessary, which is not preferable.

The configuration is such that the installation position of the gas exhaust port 148 is located higher than the horizontal level of the wafer W, so that the processing gas emitted from the gas supply head 141 passes with virtually no pooling on the wafer surface, and is exhausted from the gas exhaust port 148. In particular, this effect in combination with the previously described capability of adjusting the spacing between the wafer W and the gas supply head 141 makes it possible to reduce the phenomenon of gas pooling on the wafer surface to a substantially undetectable level, enabling a further improvement in the uniformity of film formation over the surface.

Furthermore, since $N_2$ from the gas introduction nozzle 155 purges the rear side of the holder 140, the processing gas does not intrude into that area, thus making it possible to prevent the formation of films on surfaces such as those of the holder 140, which makes it possible to greatly restrain deterioration in the thermal efficiency and the generation of particles.

Components such as the center vessel portion 136B, the lower vessel portion 136C, or the leg portion of the convex inserted portion 138A are formed of a non-transparent material so that light is excluded thereby, except for areas where the heat waves from the resistance heating means 150A and 150B for heating the wafer W have to pass, so that those portions are not subjected to an unnecessary degree of heating, enabling an increase in thermal efficiency.

Since the ceiling portion 136A of the processing vessel 136 and the optically transmissive plate 170 of the inserted base portion 138 are each formed to be dome-shaped, sufficient strength with respect to the atmosphere can be ensured for those components, even when the thickness thereof is thin.

Note that, although the second embodiment has been described above as being applied to film-formation as the thermal processing, by way of example, it is not limited thereto and can of course be applied to other thermal processing such as oxidation or thermal diffusion. In addition, the object to be processed is not limited to a semiconductor wafer; another type of substrate such as an LCD substrate or glass substrate could also be used therein.

Figure 16:
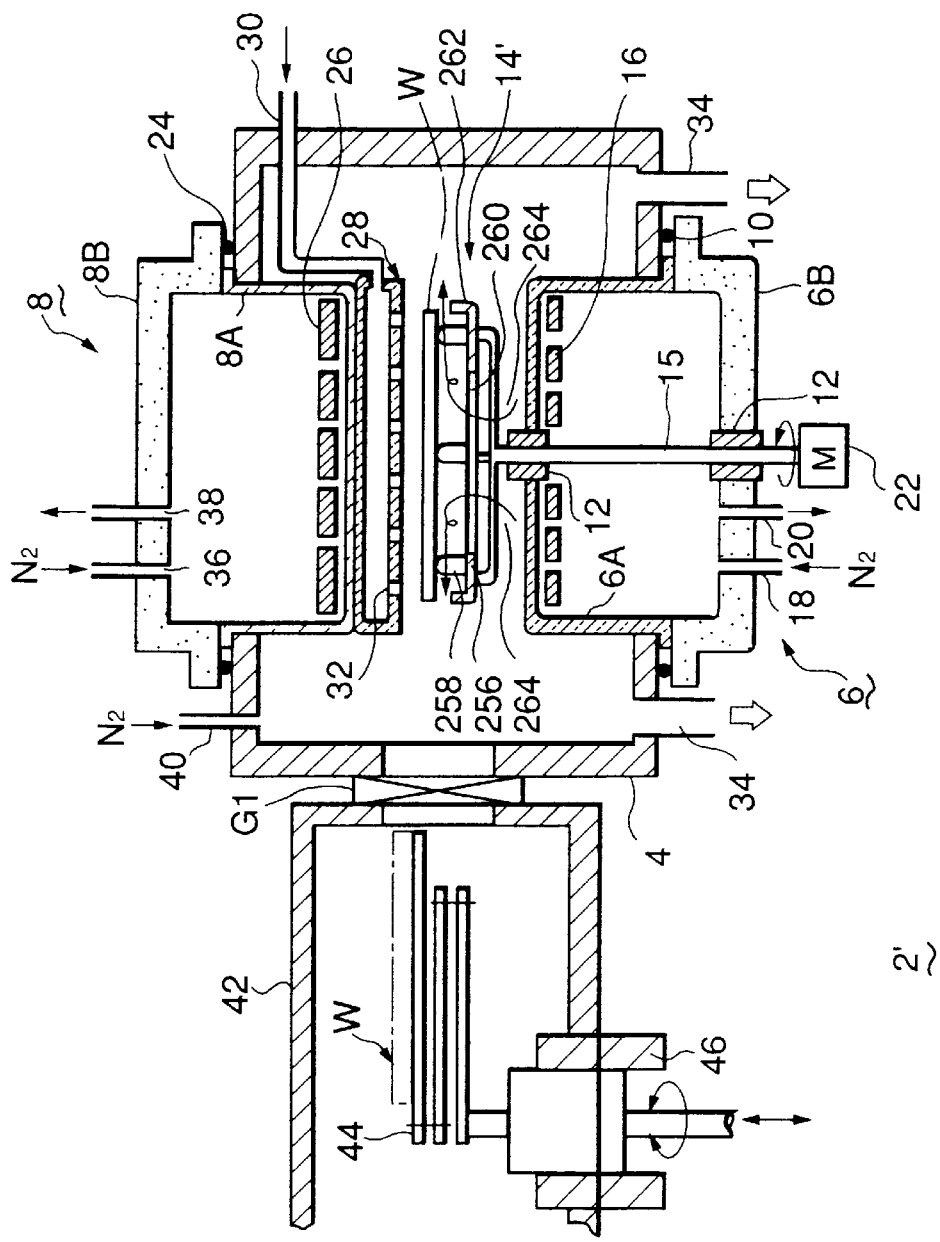
FIG. 16 is a vertical sectional view through a third embodiment of the single-wafer thermal processing apparatus of the present invention.
Figure 17:
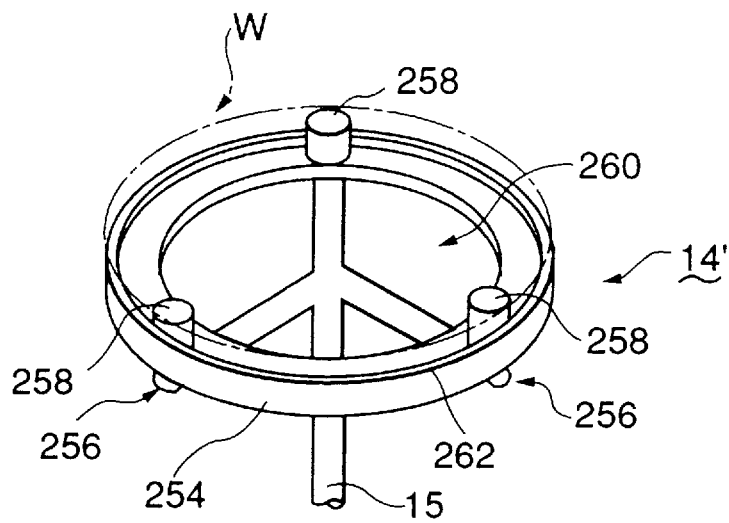
FIG. 17 is a perspective view of the holder for an object to be processed used in the thermal processing apparatus of FIG. 16.

A third embodiment of the thermal processing apparatus of this invention is shown in FIG. 16. This thermal processing apparatus is denoted overall by reference number 2' and, since it has a structure that is similar to that of the thermal treatment apparatus 2 that has already been described with reference to FIG. 2, except for certain portions thereof, components that are the same as those of the first embodiment are given the same reference numbers and further description thereof is omitted, so that the description below concerns only the portions of the third embodiment that differ from the first embodiment.

First of all, the uniform-heating ring member 50 and the elevator mechanism 52 and 53 provided in the first embodiment shown in FIG. 2 are omitted from this third embodiment.

A characteristic of the third embodiment is a holder 14' for the object to be processed. This holder 14' for the object to be processed is made of a thermal-resistant material such as quartz, as described above, it has an annular holder base 254, and a central portion thereof is formed as a throughflow hole 260 to permit the vertical flow of gas. This throughflow hole 260 makes it easy for heated gas to flow towards the rear surface side of the wafer on the holder, so that the wafer can be heated efficiently and with a good uniformity of surface temperature.

A number of leg portions 256, such as three leg portions 256, are fixed to the holder base 254. Three support protrusions 258 are disposed substantially equidistantly in the peripheral direction on an upper surface of this annular holder base 254 so as to protrude upward by approximately 10 mm, and upper ends thereof are arranged to come into direct contact with the peripheral edge of the rear surface of the semiconductor wafer W, to support it. Note that the number of support protrusions 258 is not limited to three; this number could be increased to six, by way of example, so that the load per support protrusion can be reduced and also the amount by which the wafer distorts under its own weight can be reduced.

In addition, an annular gas accumulation flange 262 is provided projecting upward around the peripheral edge of the holder base 254, in such a manner that heated gas accumulates on the rear surface side of the wafer to heat the wafer efficiently. In this case, the height of the gas accumulation flange 262 is on the order of a few mm shorter than the height of the support protrusions 258, so that the conveyor arm 44 does not collide with the gas accumulation flange 262 during the conveying in or out of the wafer W. Note that this gas accumulation flange 262 could also be set to substantially the same height as the support protrusions 258, with cutouts being formed therein only at portions where a fork-shaped conveyor arm 44 pass.

The operation of the thus configured third embodiment will now be described.

First of all, an unprocessed semiconductor wafer W from the load-lock chamber 42 is conveyed into the processing vessel 4 through the opened gate valve G1 and is received by the holder 14' for the object to be processed. In this case, the holder 14' has already been heated to the processing temperature or a lower temperature. The arm 44 is then contracted, the gate valve G1 is closed, and the interior of the processing vessel 4 is sealed.

The interior of the processing vessel 4 is evacuated to a predetermined processing pressure and also a processing gas is supplied in a shower from the gas supply head 28 thereinto, to maintain this processing pressure. Simultaneously therewith, power is supplied to the resistance heaters 16 and 26 accommodated within the lower and upper heating means vessels 6 and 8, or the power supplied thereto is increased, so that the wafer W mounted on the holder 14' is heated from both sides and is maintained at the processing temperature, and a predetermined process is performed thereon. In this case, the upper and lower resistance heaters 26 and 16 control the supply of power to each zone individually, in such a manner that the interior of the wafers surface is heated uniformly.

In particular, since the throughflow hole 260 is provided in the holder base 254 of the holder 14' for the object to be processed in accordance with this embodiment, heated internal environmental gases flow upwards from below the holder 14' for the object to be processed and through this throughflow hole 260, as shown by arrows 264 (see FIG. 16), so that these heated gases come into contact with the rear surface of the semiconductor wafer W, heat it, and flow outward horizontally. The gas accumulation flange 262 provided on the peripheral edge portion of the holder base 254 temporarily impedes this flow of gases, so that these gases flow outward through the space between the upper edge of the gas accumulation flange 262 and the peripheral edge of the wafer, while pooling therein.

The provision of the gas inlet port 160 in the gas introduction pipeline 154 in this manner ensures that the heated gases rise and flow into the rear surface side of the wafer, making it possible to increase the efficiency of wafer heating and further improve the uniformity of the surface temperature thereof.

The gas accumulation flange 262 provided on the peripheral edge portion of the holder base 254 causes the heated gases pool temporarily on the rear surface side of the wafer, making it possible to increase the efficiency of wafer heating and further improve the uniformity of the surface temperature thereof, by that amount.

Figure 18:
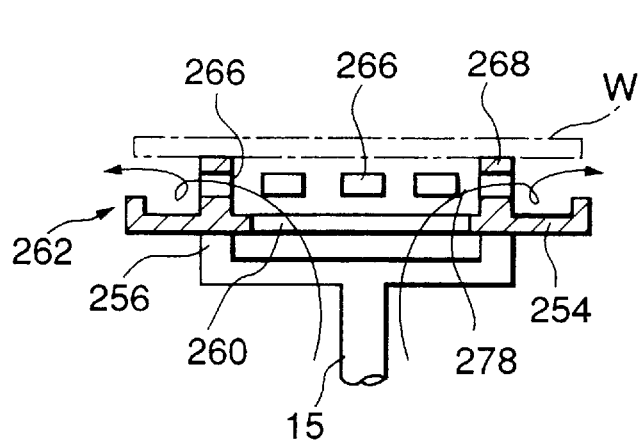
FIG. 18 is a vertical sectional view through a variant of the holder for an object to be processed.
Figure 19:
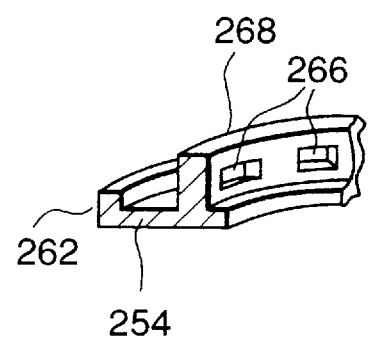
FIG. 19 is a partially cutaway perspective view of the holder for an object to be processed of FIG. 18.

The support protrusions 258 of the holder base 254 of this embodiment are provided at three separate locations, but an annular support protrusion 268 could be provided instead, as shown in FIGS. 18 and 19. FIG. 18 is a sectional view through such a holder for the object to be processed and FIG. 19 is a partial cutaway perspective view thereof.

In this case, the annular support protrusion 268 shown in these figures is formed to protrude upward in an annular manner around the peripheral direction of the holder 14' and a plurality of gas removal holes 266 are provided in a side wall thereof, of a rectangular form, for example. These gas removal holes 266 are formed at a predetermined spacing along the annular peripheral direction, but the size and number thereof are preferably such as to increase the area of the passageways therethrough. This ensures that, after flowing from below and upward through the throughflow hole 260 as shown by arrows 278 to strike the rear surface of the wafer and thus heat it, the heated gases flow outward through the gas removal holes 266. In this case too, this configuration not only increases the wafer heating efficiency and the surface temperature uniformity as described previously, the support protrusion 268 comes into contact with the rear surface of the wafer, making it possible to support the weight thereof, and thus making it possible to restrain the occurrence of slippage and crystal defects by that amount. This is particularly effective for a 12-inch wafer wherein the size and also the self-weight of the wafer are greater.

Figure 20:
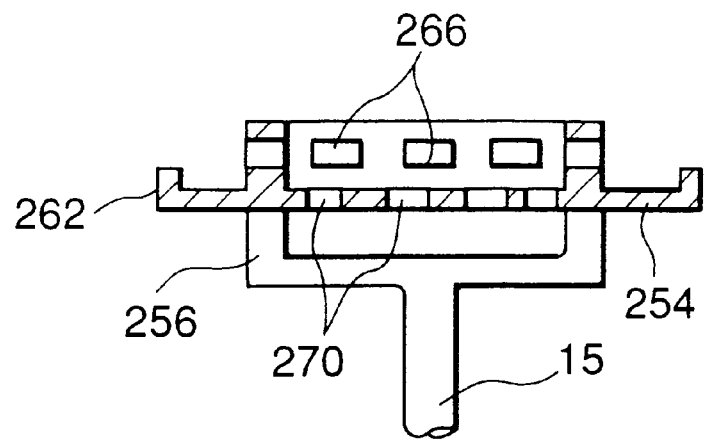
FIG. 20 is a view of a variant of the holder for an object to be processed.

In the above described embodiment, the throughflow hole 260 provided in the holder base 254 was implemented as a large-diameter throughflow hole, but instead the holder base 254 could be formed as a circular plate and throughflow holes 270 could be provided therein by forming a large number of small-diameter holes in the central portion thereof, as shown in FIG. 20.

Figure 21:
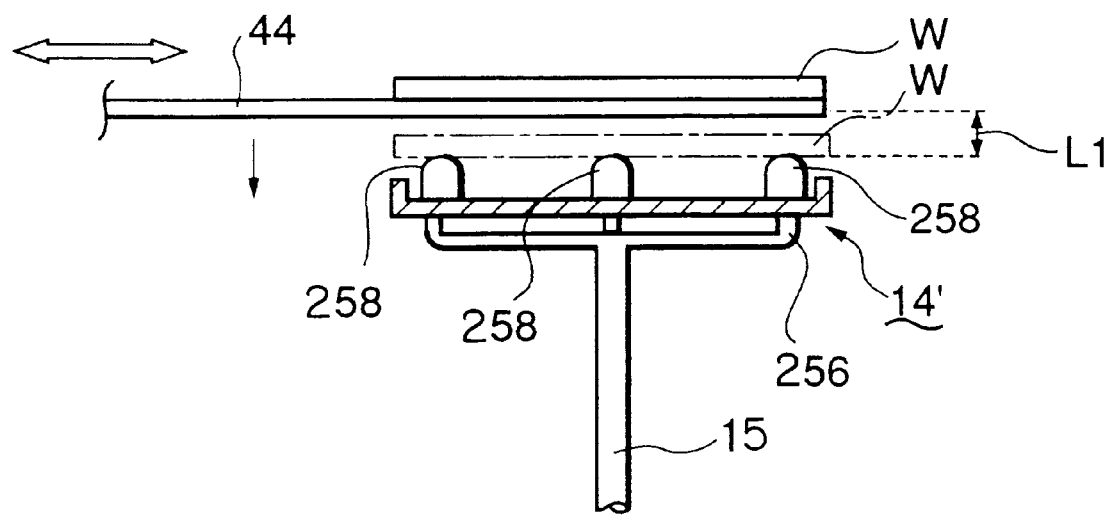
FIG. 21 is an illustrative view of the operations when an object to be processed is conveyed into and out of the holder.

In addition, when a wafer W at room temperature is conveyed into the processing vessel 4 by the conveyor arm 44 and placed on the holder 14' for the object to be processed in accordance with the above embodiment, the wafer W which is still at substantially room temperature is placed on the holder 14' for the object to be processed which has previously been heated to a high temperature, so there is a danger that parts of the wafer W will be heated abruptly, causing slippage and crystal defects to occur. To restrain these phenomena, after the wafer has been conveyed in, that is, before it has been placed on the holder 14' for the object to be processed, the wafer W could be conveyed into the processing vessel by the conveyor arm 44 then the wafer W could be made to wait for a short while in a floating state until the wafer W has been pre-heated to a predetermined temperature, as shown in FIG. 21. This waiting time and the pre-heating temperature depend on the wafer processing temperature, but if the processing temperature is 1000° C., by way of example, the waiting time could be set on the order of 1 to 20 seconds and the preheating of the wafer W could be to 600 to 700° C. In such a case, it is preferable that the distance L1 between the waiting wafer W and the support protrusions 258 of the holder 14' for the object to be processed is set to be within a range on the order of 1.0 to 10 mm, so that the pre-heating effect and the pre-heating time are balanced.

In this manner, the utilization of a pre-heating method that makes the wafer float and wait within the processing vessel 4 ensures that thermal shock can be alleviated when the wafer W is placed upon the holder 14' for the object to be processed, thus making it possible to restrain the occurrence of slippage and crystal defects.

In each of the above embodiments, the wafer W is placed directly on the holder 14' for the object to be processed, so that if, for example, the temperature difference between the two objects is too great, there still remains a danger that slippage and crystal defects will occur, even if the above described pre-heating has been performed. In order to substantially remove this danger completely, a supplementary support stand could be provided that is conveyed in and out together with the wafer. The configuration of a thermal processing apparatus provided with such a supplementary support stand is shown in FIG. 22 and a perspective view of this supplementary support stand is shown in FIG. 23.

Figure 22:
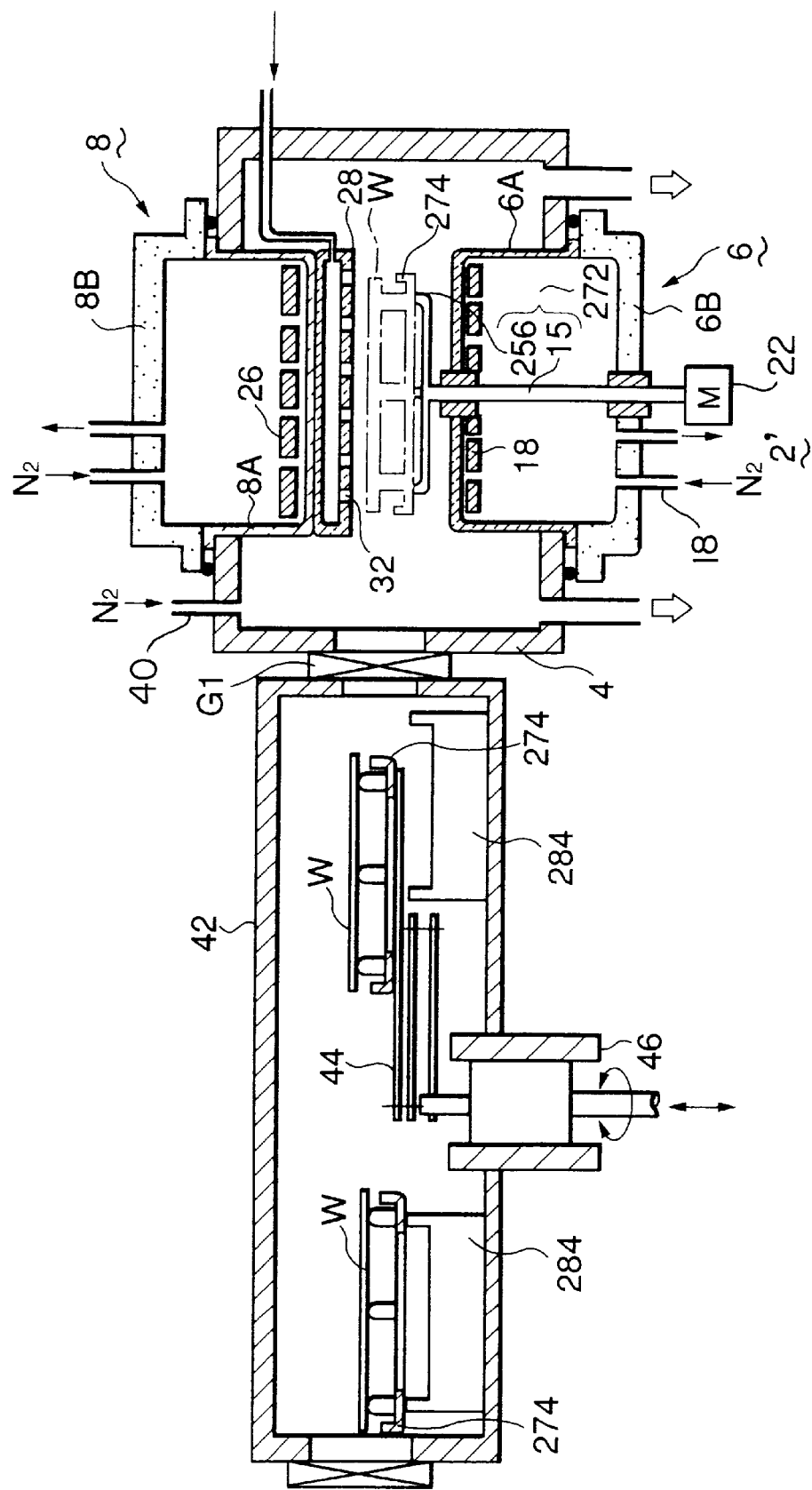
FIG. 22 is a vertical sectional view of an embodiment of the thermal processing apparatus using a supplementary support stand.

Since the thermal processing apparatus of FIG. 22 has exactly the same structure as that of the thermal treatment apparatus 2 of FIG. 16, except that the configuration of the holder for the object to be processed is different and the supplementary support stand is provided, so components that are the same are given the same reference numbers and further description thereof is omitted. In other words, the provision of the holder 14' for the object to be processed on the three leg portions 256 at the upper end of the support shaft 15 in the configuration of FIG. 16 results in an integral structure, but in this case, a holder 272 for the object to be processed is configured of the support shaft 15 and the leg portions 256 provided at the upper end thereof. The holder 14' for the object to be processed of FIG. 16 is separated from the leg portions 256 to form a supplementary support stand 274 in this embodiment. Therefore, this supplementary support stand 274 has exactly the same structure as the holder 14' for the object to be processed of FIG. 16, except that this supplementary support stand 274 can be conveyed into and out of the processing vessel 4 together with the wafer W, in a state in which the wafer W is placed thereon, so that the supplementary support stand 274 can be placed on top of the holder 14' for the object to be processed. In FIG. 22, this supplementary support stand 274 is shown in a state in which it is being conveyed outward into the load-lock chamber 42.

Figure 23:
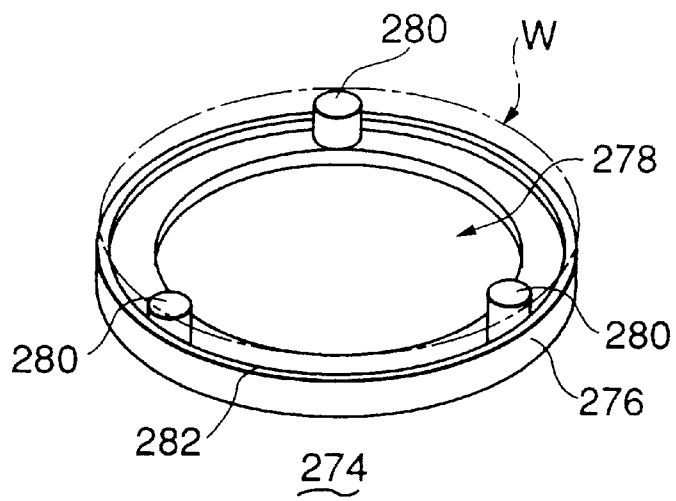
FIG. 23 is a perspective view of the supplementary support stand of FIG. 22.

The supplementary support stand 274 shown in FIG. 23 has an annular support stand base 276 made of a material that is resistant to heat, such as quartz, and a central portion thereof is formed as a throughflow hole 278 to permit the vertical flow of gas. This throughflow hole 278 makes it easy for heated gas to flow towards the rear surface side of the wafer, so that the wafer can be heated efficiently and with a good uniformity of surface temperature.

Three support protrusions 280 are disposed substantially equidistantly in the peripheral direction on an upper surface of this annular support stand base 276 so as to protrude upward by approximately 10 mm, and upper ends thereof are arranged to come into direct contact with the peripheral edge of the rear surface of the semiconductor wafer W, to support it. Note that the number of support protrusions 280 is not limited to three; this number could be increased to six, by way of example, so that the load per support protrusion can be reduced and also the amount by which the wafer distorts under its own weight can be reduced.

In addition, an annular gas accumulation flange 282 is provided projecting upward around the peripheral edge of the support stand base 276, in such a manner that heated gas accumulates on the rear surface side of the wafer to heat the wafer efficiently. In this case, the height of the gas accumulation flange 282 is on the order of a few mm shorter than the height of the support protrusions 280, so that the conveyor arm 44 does not collide with the gas accumulation flange 282 when the wafer W is being separated from the supplementary support stand 274. Note that this gas accumulation flange 282 could also be set to substantially the same height as the support protrusions 280, with cutouts being formed therein only at portions where a fork-shaped conveyor arm 44 pass.

Two supplementary support stand receptacles 284 are disposed within the load-lock chamber 42 for holding the supplementary support stand 274, with the configuration being such that they are used alternately. Note that the number of supplementary support stand receptacles 284 is not limited thereto, so that one or three or more could be provided, and these supplementary support stand receptacles 284 are of course provided at locations which do not impede the conveyor arm 44.

If the description now turns to the flow of thermal processing when this supplementary support stand 274 is used, an empty supplementary support stand 274 has been placed on one of the supplementary support stand receptacles 284 in the load-lock chamber 42, then an unprocessed wafer W is extracted from a cassette chamber (not shown in the figure) by the conveyor arm 44 and is moved onto the supplementary support stand 274.

The conveyor arm 44 is then contracted and extended to insert it under the supplementary support stand 274 and hold the supplementary support stand 274 together with the wafer W, then convey the supplementary support stand 274 together with the wafer W into the processing vessel 4 through the opened gate valve G1. The supplementary support stand 274 together with the wafer W is placed upon the holder 272 for the object to be processed within the processing vessel 4, to complete the movement of the wafer W.

A predetermined thermal process is subsequently performed as described previously, and, at the completion thereof, the above operation is reversed to convey the wafer W out. In other words, the conveyor arm 44 is inserted below the supplementary support stand 274 to pick it up together with the wafer W, then the supplementary support stand 274 with the wafer is moved into the load-lock chamber 42 by the contraction of the conveyor arm 44, and is placed on the supplementary support stand receptacle 284.

The wafer W is cooled to a certain extent by leaving it in this state for a predetermined time. During this cooling, another supplementary support stand 274 could be used to convey an unprocessed wafer W into the processing vessel 4 in the same manner as described previously.

When this cooling has been completed to a predetermined temperature, the conveyor arm 44 could be extended and contracted to pick up only the wafer W and convey it out towards a cassette chamber (not shown in the figure), leaving the supplementary support stand 274 on the supplementary support stand receptacle 284.

The use of the supplementary support stand 274 in this manner ensures that the conveyor arm 44 at room temperature does not come into direct contact with the wafer W which is at a high temperature directly after being processed, so there is no abrupt cooling locally on the wafer W and it is thus possible to prevent the occurrence of slippage and crystal defects, substantially reliably. In addition, the supplementary support stand 274 is formed in a similar manner to the holder 14' shown in FIG. 16, so that heated gases can flow over the rear surface of the wafer, which also helps improve the heating efficiency and the uniformity of surface temperature of the wafer, as described previously. In this case, the above configuration of the holder 272 and supplementary support stand 274 was merely given as an example; it is of course not limited thereto. For example, the configuration could be such that the holder 14' shown in FIG. 16 is superimposed on the supplementary support stand 274 so that thermal processing is performed with a two-stage structure.

Figures 24, 25:
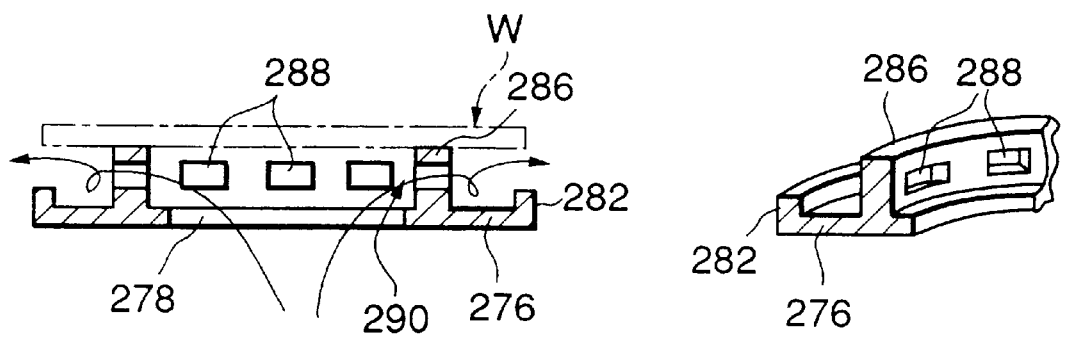
FIG. 24 shows a variant of the supplementary support stand.
FIG. 25 is a partially cutaway view of the supplementary support stand of FIG. 24.

The support protrusions 280 of the support stand base 276 of the above embodiment are provided at three separate locations, but an annular support protrusion 286 could be provided instead, as shown in FIGS. 24 and 25. FIG. 24 is a cross-sectional view through such a supplementary support stand and FIG. 25 is a partial cutaway perspective view thereof.

In this case, the support protrusion 286 shown in these figures is formed to protrude upward in an annular manner around the peripheral direction of the supplementary support stand 274 and a plurality of gas removal holes 288 are provided in a side wall thereof, of a rectangular form, for example. These gas removal holes 288 are formed at a predetermined spacing along the annular peripheral direction, but the size and number thereof are preferably such as to increase the area of the passageways therethrough. This ensures that, after flowing from below and upward through the throughflow hole 278 as shown by arrows 290 to strike the rear surface of the wafer and thus heat it, the heated gases flow outward through the gas removal holes 288. In this case too, this configuration not only increases the wafer heating efficiency and the surface temperature uniformity as described previously, the support protrusion 286 comes into contact with the rear surface of the wafer, making it possible to support the weight thereof, and thus making it possible to restrain the occurrence of slippage and crystal defects by that amount. This is particularly effective for a 12-inch wafer wherein the size and also the self-weight of the wafer are greater. Reference number 282 denotes an annular gas accumulation flange.

Figure 26:
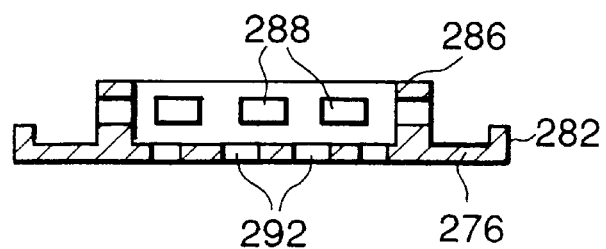
FIG. 26 is a vertical sectional view of another variant of the supplementary support stand.
Figure 27:
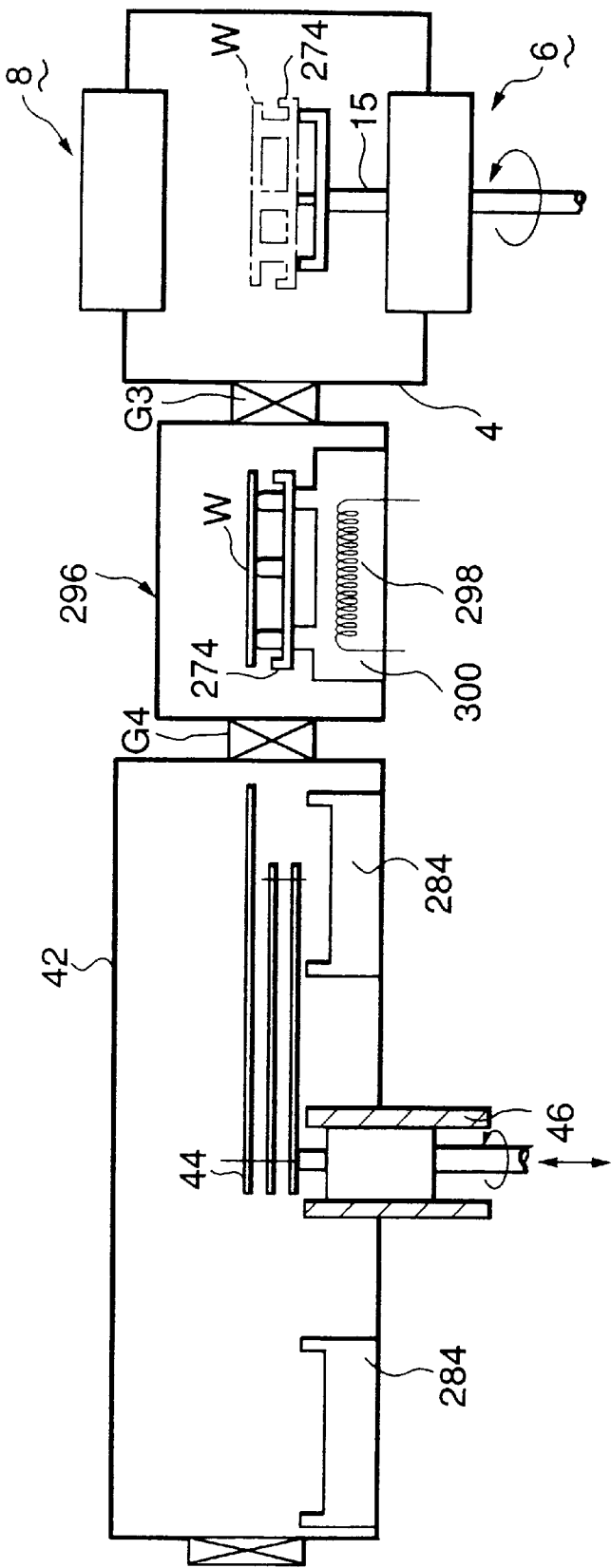
FIG. 27 is a schematic structural view of an example provided with a pre-heating chamber between the processing vessel and the load-lock chamber.

In the above described embodiment, the throughflow hole 278 provided in the support stand base 276 was implemented as a large-diameter throughflow hole, but instead support stand base 276 could be formed as a circular plate and throughflow holes 292 could be provided therein by forming a large number of small-diameter holes in the central portion thereof, as shown in FIG. 26.

Furthermore, in each of the above described embodiments, the description concerned a configuration in which the load-lock chamber 42 and the processing vessel 4 were connected directly by a gate valve G1, by way of example, but the configuration is not limited thereto and a pre-heating chamber 296 could be provided between the processing vessel 4 and the load-lock chamber 42, separated therefrom by freely openable gate valves G3 and G4. A heating stand 300 with an internal heater 298 is provided within this pre-heating chamber 296, and either a wafer W alone or a wafer W placed upon the supplementary support stand 274 could be pre-heated therein. Not only does this make the thermal shock with respect to the wafer even smaller and also further reduce the occurrence of slippage and crystal defects, the amount of pre-heating also makes it possible to improve the throughput of the thermal processing. Note that the stroke of the conveyor arm 44 used in this case is of course set to long enough for the length of the pre-heating chamber 296.

INDUSTRIAL APPLICABILITY

Other than semiconductor wafers, the present invention can be used for the thermal processing of glass substrates, LCD substrates, or the like. Other than film-formation, this thermal processing includes oxidation, diffusion, and annealing.

What is claimed is:

1. A single-wafer type of thermal processing apparatus provided with a processing vessel and a holder for an object to be processed, which is provided within said processing vessel to hold an object to be processed, wherein said thermal processing apparatus comprises:

a lower heating means provided within said processing vessel and below said holder for an object to be processed, for heating said object;

a lower heating means vessel for entirely enclosing said lower heating means in a sealed state with respect to said processing vessel;

an upper heating means provided within said processing vessel and above said holder, for heating said object;

an upper heating means vessel for entirely enclosing said upper heating means in a sealed state with respect to said processing vessel;

a processing gas supply means for supplying a processing gas to an area between said holder and said upper heating means;

means for maintaining said processing vessel and said lower and upper heating means vessels at predetermined pressures; and a gas supply system connected to said processing vessel and said two heating means vessels, for supplying a gas while maintaining the pressure within said three vessels to within a predetermined pressure range.

2. The thermal processing apparatus as defined in claim 1, further comprising a gas exhaust system connected to said processing vessel and said two heating means vessels, for exhausting the internal atmosphere while maintaining the pressure within said three vessels to within a predetermined pressure range.

3. The thermal processing apparatus as defined in claim 2, wherein each of said gas supply system and said gas exhaust system comprises a common gas passageway connected in common to said three vessels, passageways linking said common gas passageway to said vessels, and a differential pressure drive valve interposed within said passageways.

4. The thermal processing apparatus as defined in claim 2, wherein each of said gas supply system and said gas exhaust system comprises a common gas passageway connected in common to said three vessels, passageways linking said common gas passageway to said vessels, a first flowrate control valve provided in a passageway connecting said common gas passageway to said lower heating means vessel, a second flowrate control valve provided in a passageway connecting said common gas passageway to said upper heating means vessel, means for controlling the degree of opening of said first flowrate control valve in accordance with a difference between the pressure within said processing vessel and said lower heating means vessel, and means for controlling the degree of opening of said second flowrate control valve in accordance with a difference between the pressure within said processing vessel and said upper heating means vessel.

5. A single-wafer type thermal processing apparatus provided with a processing vessel and a holder for an object to be processed, which is provided within said processing vessel to hold an object to be processed, wherein said thermal processing apparatus comprises:

- a lower heating means provided within said processing vessel and below said holder for an object to be processed, for heating said object;
- a lower heating means vessel for accommodating said lower heating means in a sealed state with respect to said processing vessel;
- an upper heating means provided within said processing vessel and above said holder, for heating said object;
- an upper heating means vessel for accommodating said upper heating means in a sealed state with respect to said processing vessel;
- a processing gas supply means for supplying a processing gas to an area between said holder and said upper heating means;
- means for maintaining said processing vessel and said lower and upper heating means vessels at predetermined pressures; and
- a cylindrical uniform-heating ring member positioned on a peripheral edge of said holder to cover a side portion of said object held on said holder, wherein said uniform-heating ring member is capable of changing position vertically.

6. The thermal processing apparatus as defined in claim 1, wherein said lower and upper heating means are electrical resistance heaters.

7. The thermal processing apparatus as defined in claim 1, wherein said holder is provided in a manner capable of vertical positional adjustment.

8. The thermal processing apparatus as defined in claim 1, wherein said processing gas supply portion has flattened shape in the horizontal direction, with a large number of processing gas ejection holes in a lower surface thereof.

9. The thermal processing apparatus as defined in claim 1, further comprising a gas exhaust port at a position lower than that of said holder, for evacuating the atmosphere within said processing vessel.

10. The thermal processing apparatus as defined in claim 1, wherein each of said lower and upper heating means is divided into a plurality of concentric zones, such that temperature control can be provided for each of said zones.

11. The thermal processing apparatus as defined in claim 1, wherein each of said lower and upper heating means has a diameter that is between 1.2 and 1.5 times the diameter of said object to be processed.

12. The thermal processing apparatus as defined in claim 1, wherein said holder comprises a holder base; a support protrusion protruding upward therefrom, for supporting a peripheral edge portion of a rear surface of said object to be processed; and a gas throughflow hole provided in said holder base, for permitting gases to flow in the vertical direction.

13. The thermal processing apparatus as defined in claim 12, Wherein said support protrusion is formed in an annular shape and is also provided with gas removal holes.

14. The thermal processing apparatus as defined in claim 1, further comprising a supplementary support stand which is capable of being mounted on said holder and which also receives said object to be processed directly, wherein said supplementary support stand is capable of being conveyed into said processing vessel and out of said processing vessel with said object to be processed received thereon.

* * * * *